United States Patent [19]

Shimizume et al.

[11] Patent Number: 5,486,827
[45] Date of Patent: Jan. 23, 1996

[54] EFM MODULATOR FOR CONTROLLING DIGITAL SUM VARIATION OF ENCODED DATA

[75] Inventors: Kazutoshi Shimizume; Shinobu Nakamura, both of Kanagawa, Japan

[73] Assignee: Sony Corporation, Tokyo, Japan

[21] Appl. No.: 136,949

[22] Filed: Oct. 18, 1993

[30] Foreign Application Priority Data

Oct. 22, 1992 [JP] Japan .................................. 4-284319

[51] Int. Cl.$^6$ .................................................. H03M 5/00
[52] U.S. Cl. .................................................. 341/58; 341/95
[58] Field of Search .................................. 341/58, 68, 95

[56] References Cited

U.S. PATENT DOCUMENTS

| | | | |
|---|---|---|---|
| 4,728,929 | 3/1988 | Tanaka | 341/68 |
| 5,136,436 | 8/1992 | Kahlman | 360/40 |
| 5,196,848 | 3/1993 | Sakazaki | 341/58 |
| 5,304,997 | 4/1994 | Konno | 341/95 |
| 5,349,349 | 9/1994 | Shimizume | 341/58 |
| 5,365,231 | 11/1994 | Niimura | 341/58 |

FOREIGN PATENT DOCUMENTS

| | | |
|---|---|---|
| 0347934 | 12/1989 | European Pat. Off. . |
| 0476766 | 3/1992 | European Pat. Off. . |
| 0535560 | 4/1993 | European Pat. Off. . |

OTHER PUBLICATIONS

Patent Abstracts of Japan vol. 12, No. 174 (E–612) 24 May 1988 & JP–A–62 281 523 (Matsushita) 7 Dec. 1987.

*Primary Examiner*—Marc S. Hoff
*Attorney, Agent, or Firm*—William S. Frommer; Alvin Sinderbrand

[57] ABSTRACT

A modulator suppressing a low-frequency component of a recording waveform while limiting maximum and minimum recording wavelengths, comprising a margin bit generating circuit for generating a most suitable margin bit pattern based on a signal concerning a final recording waveform level of each of n channel bit patterns to be put before a margin bit pattern to be inhibited, control signals concerning a polarity of a cumulative digital sum variation, a control signal coming from a digital sum variation integrating circuit to switch between gains by detecting a magnitude of an absolute value of the digital sum variation, and a signal concerning the cumulative digital sum variation of each of the n channel bit patterns to be put after the above-mentioned margin bit pattern.

3 Claims, 27 Drawing Sheets

FIG. 1(A)
SAMPLING FREQUENCY : 44.1 kHz
QUANTIZATION NUMBER : 16 BITS (LINEAR)
MODULATING : EFM
CHANNEL BIT RATE : 4.3218 Mbps
ERROR CORRECTION : CIRC
DATA TRANSFER RATE : 2.034 Mbps
FIG. 1(B)
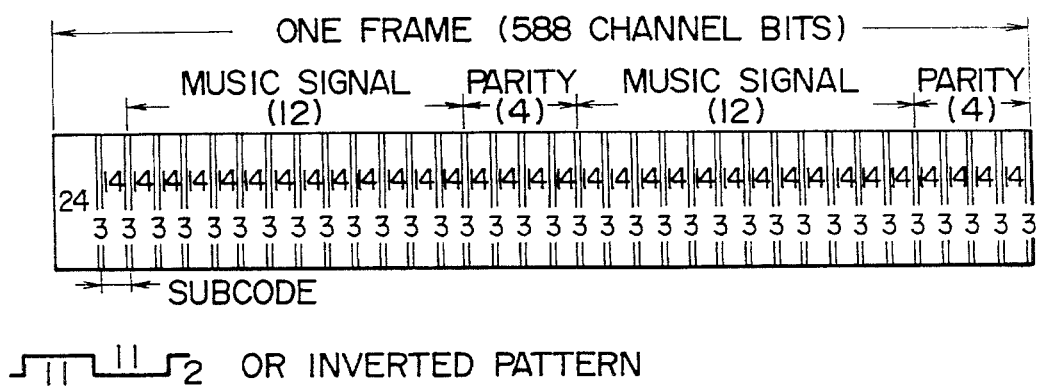
FIG. 1(C)
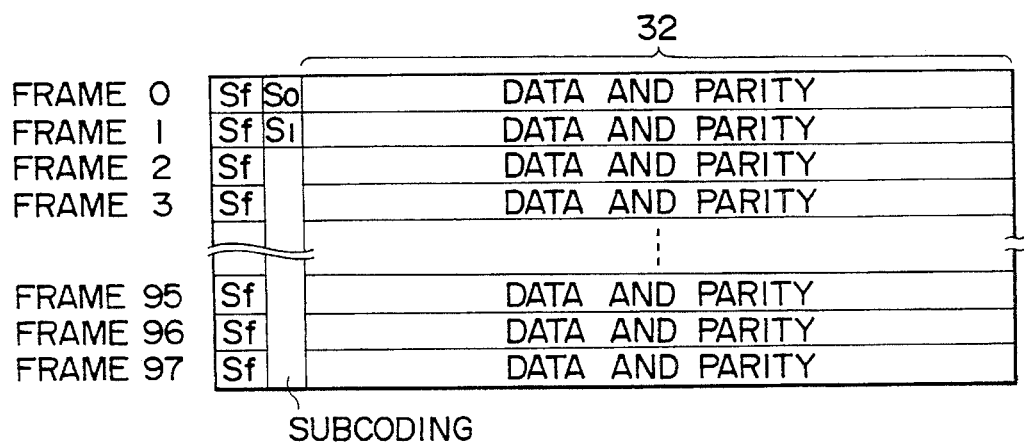

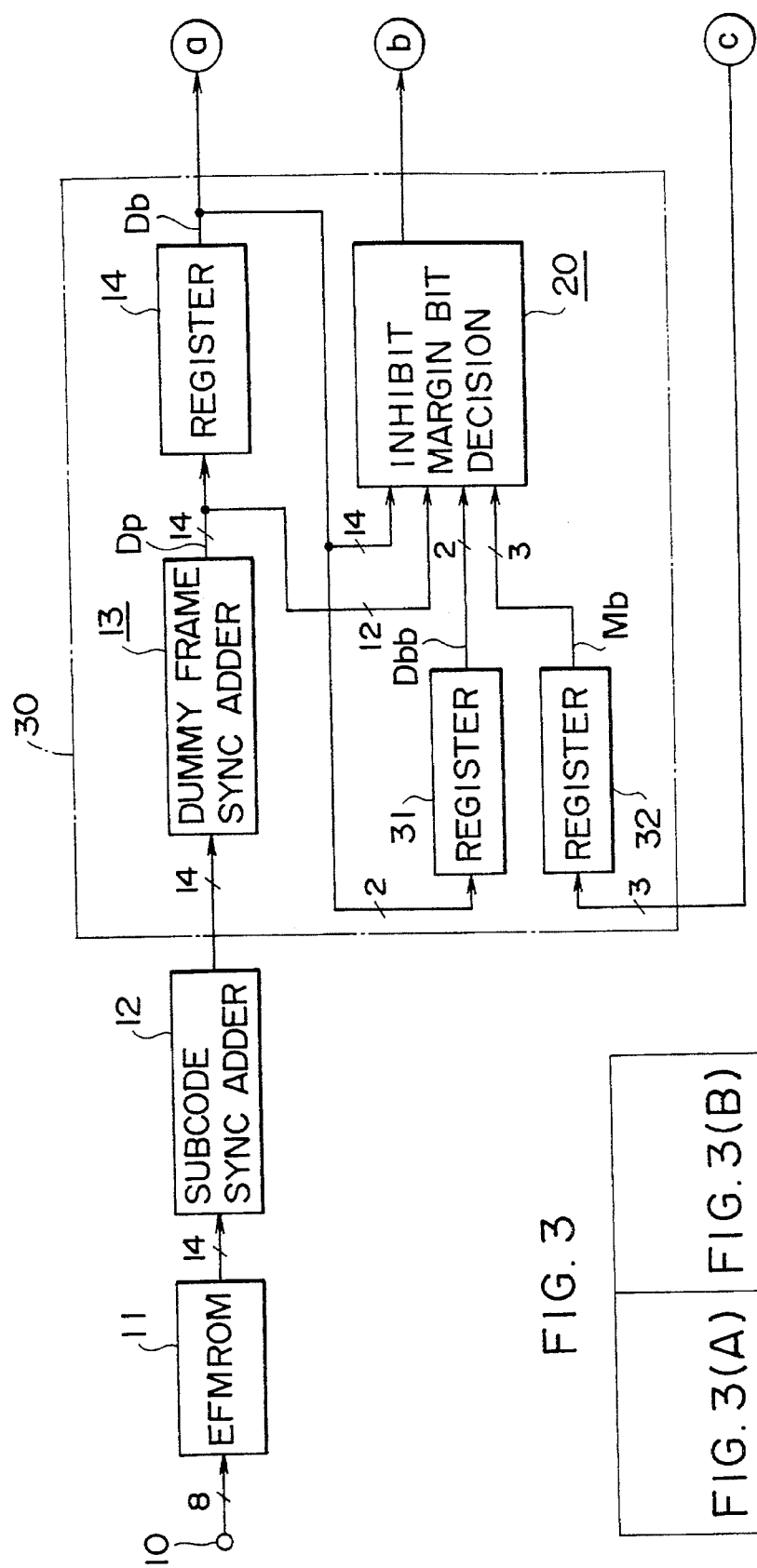

| INPUT | | OUTPUT |
|---|---|---|
| CWLL | CONTROL SIGNAL FROM DSV INTEGRATOR 60 | |
| 0 | 1 0 0 (INCREMENT COMMAND) | 1 0 0 |
| 0 | 0 1 0 (BALANCE COMMAND) | 0 1 0 |
| 0 | 0 0 1 (DECREMENT COMMAND) | 0 0 1 |
| 1 | 1 0 0 (INCREMENT COMMAND) | 0 0 1 |
| 1 | 0 1 0 (BALANCE COMMAND) | 0 1 0 |
| 1 | 0 0 1 (DECREMENT COMMAND) | 1 0 0 |

FIG. 10(B) PRIOR ART

| INPUT (14NWD) | OUTPUT | |
|---|---|---|
| ⋮<br>0 0 1 0 0<br>0 0 0 1 1 | 1 0 0 0 | $14NWD \geq 3$ |
| 0 0 0 1 0 | 0 1 0 0 | $14NWD = 2$ |
| 0 0 0 0 1 | 0 0 1 0 | $14NWD = 1$ |
| 0 0 0 0 0 | 0 0 0 1 | $14NWD = 0$ |
| 1 1 1 1 1<br>1 1 1 1 0<br>⋮ | 0 0 0 0 | $14NWD \leq -1$ |

FIG. 11(A)
PRIOR ART

| CWLL | 14NWD | | | | | INHIBIT SIGNAL | | | | CONTROL SIGNAL | | | MARGIN BIT OUTPUT | PRIORITY | REMARKS |
|---|---|---|---|---|---|---|---|---|---|---|---|---|---|---|---|
| | ≤-1 | 0 | 1 | 2 | +3≤ | 001 | 010 | 100 | 000 | + | 0 | - | | | |
| 0 | X | 0 | 0 | 0 | 1 | X | X | X | 0 | X | X | 0 | 000 | 1 | 14NWD=3 OR MORE AND THE CONTROL SIGNAL IS INCREMENT OR BALANCE |
| | | | | | | X | X | 0 | 1 | | | | 100 | 2 | |
| | | | | | | X | 0 | 1 | 1 | -DO- | | | 010 | 3 | |
| | | | | | | 0 | 1 | 1 | 1 | | | | 001 | 4 | |
| | -DO- | | | | | X | 0 | X | X | X | X | 1 | 010 | 1 | 14NWD=3 OR MORE AND THE CONTROL SIGNAL IS INCREMENT OR BALANCE |
| | | | | | | 0 | 1 | X | X | | | | 001 | 2 | |
| | | | | | | 1 | 1 | 0 | X | -DO- | | | 100 | 3 | |
| | | | | | | 1 | 1 | 1 | 0 | | | | 000 | 4 | |
| | X | 0 | 0 | 1 | 0 | X | X | 0 | X | X | X | 0 | 100 | 1 | 14NWD=2 AND THE CONTROL SIGNAL IS INCREMENT OR BALANCE |
| | | | | | | X | X | 1 | 0 | | | | 000 | 2 | |
| | | | | | | X | 0 | 1 | 1 | -DO- | | | 010 | 2 | |
| | | | | | | 0 | 1 | 1 | 1 | | | | 001 | 3 | |
| | -DO- | | | | | X | X | X | 0 | X | X | 1 | 000 | 1 | 14NWD=2 AND THE CONTROL SIGNAL IS DECREMENT |
| | | | | | | X | 0 | X | 1 | | | | 010 | 1 | |
| | | | | | | 0 | 1 | X | 1 | -DO- | | | 001 | 2 | |
| | | | | | | 1 | 1 | 0 | 1 | | | | 100 | 3 | |
| | X | 0 | 1 | 0 | 0 | X | X | 0 | X | 1 | X | X | 100 | 1 | 14NWD=1 AND THE CONTROL SIGNAL IS INCREMENT |
| | | | | | | X | 0 | 1 | X | | | | 010 | 2 | |
| | | | | | | 0 | 1 | 1 | X | -DO- | | | 001 | 3 | |
| | | | | | | 1 | 1 | 1 | 0 | | | | 000 | 3 | |
| | -DO- | | | | | X | 0 | X | X | X | 1 | X | 010 | 1 | 14NWD=1 AND THE CONTROL SIGNAL IS INCREMENT |
| | | | | | | 0 | 1 | X | X | | | | 001 | 2 | |
| | | | | | | 1 | 1 | 0 | X | -DO- | | | 100 | 2 | |
| | | | | | | 1 | 1 | 1 | 0 | | | | 000 | 2 | |
| | | | | | | X | X | X | 0 | X | X | 1 | 000 | 1 | 14NWD=1 AND THE CONTROL SIGNAL IS DECREMENT |
| | | | | | | 0 | X | X | 1 | | | | 001 | 1 | |
| | | | | | | 1 | 0 | X | 1 | -DO- | | | 010 | 2 | |
| | | | | | | 1 | 1 | 0 | 1 | | | | 100 | 3 | |

FIG. 11(B)
PRIOR ART

| CWLL | 14 NWD | | | | | INHIBIT SIGNAL | | | | CONTROL SIGNAL | | | MARGIN BIT OUTPUT | PRIORITY | REMARKS |
|---|---|---|---|---|---|---|---|---|---|---|---|---|---|---|---|
| | ≤-1 | 0 | 1 | 2 | +3≤ | 001 | 010 | 100 | 000 | + | 0 | - | | | |
| 0 | X | 1 | 0 | 0 | 0 | X | X | 0 | X | 1 | X | X | 100 | 1 | 14NWD=0 AND THE CONTROL SIGNAL IS INCREMENT |
| | | | | | | X | 0 | 1 | X | -DO- | | | 010 | 2 | |
| | | | | | | 0 | 1 | 1 | X | | | | 001 | 3 | |
| | | | | | | 1 | 1 | 1 | 0 | | | | 000 | 4 | |
| | -DO- | | | | | X | 0 | X | X | X | 1 | X | 010 | 1 | 14NWD=0 AND THE CONTROL SIGNAL IS BALANCE |
| | | | | | | 0 | 1 | X | X | | | | 001 | 1 | |
| | | | | | | 1 | 1 | 0 | X | -DO- | | | 100 | 2 | |
| | | | | | | 1 | 1 | 1 | 0 | | | | 000 | 2 | |
| | | | | | | X | X | X | 0 | X | X | 1 | 000 | 1 | 14NWD=0 AND THE CONTROL SIGNAL IS DECREMENT |
| | | | | | | 0 | X | X | 1 | | | | 001 | 2 | |
| | | | | | | 1 | 0 | X | 1 | -DO- | | | 010 | 3 | |
| | | | | | | 1 | 1 | 0 | 1 | | | | 100 | 4 | |
| | X | 0 | 0 | 0 | 0 | X | 0 | X | X | 1 | X | X | 010 | 1 | 14NWD=-1 OR LESS AND THE CONTROL SIGNAL IS INCREMENT |
| | | | | | | X | 1 | 0 | X | | | | 100 | 2 | |
| | | | | | | 0 | 1 | 1 | X | -DO- | | | 001 | 3 | |
| | | | | | | 1 | 1 | 1 | 0 | | | | 000 | 4 | |
| | -DO- | | | | | 0 | X | X | X | X | 1 | X | 001 | 1 | 14NWD=-1 OR LESS AND THE CONTROL SIGNAL IS BALANCE |
| | | | | | | 1 | 0 | X | X | | | | 010 | 2 | |
| | | | | | | 1 | 1 | 0 | X | -DO- | | | 100 | 3 | |
| | | | | | | 1 | 1 | 1 | 0 | | | | 000 | 3 | |
| | | | | | | X | X | X | 0 | X | X | 1 | 000 | 1 | 14NWD=-1 OR LESS AND THE CONTROL SIGNAL IS DECREMENT |
| | | | | | | 0 | X | X | 1 | | | | 001 | 2 | |
| | | | | | | 1 | 0 | X | 1 | -DO- | | | 010 | 3 | |
| | | | | | | 1 | 1 | 0 | 1 | | | | 100 | 4 | |

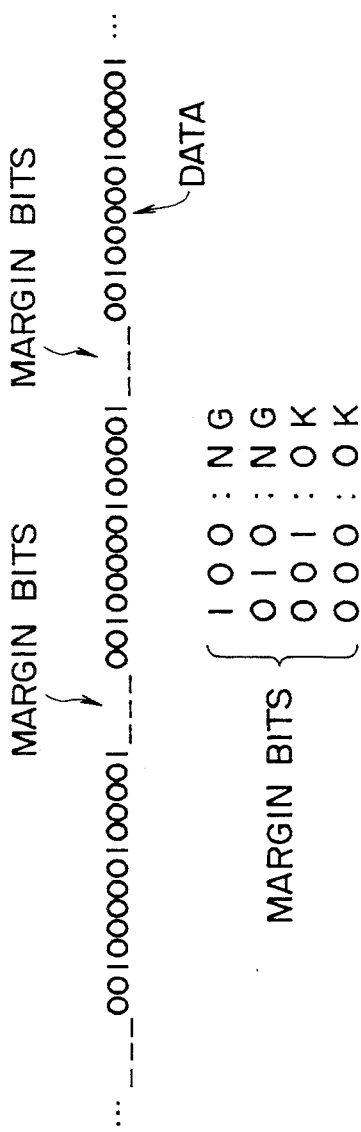
F I G. 12
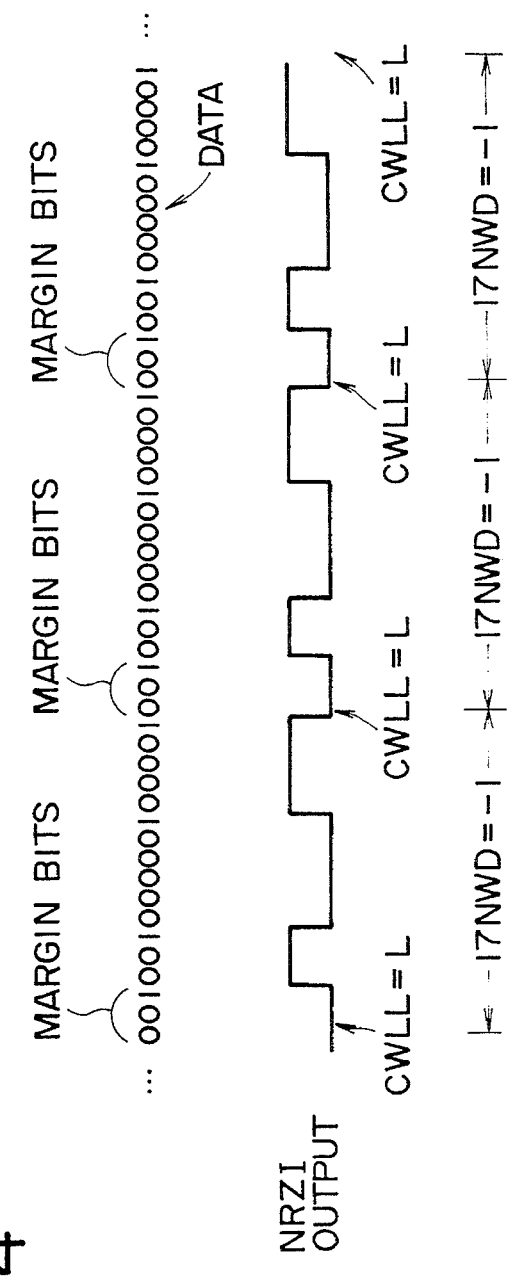
F I G. 14

| FIG.13(A) | FIG.13(B) |

FIG. 19

| DATA (8 BITS) | DECIMAL NUMBER | |
|---|---|---|
| 0 1 1 1 1 1 1 1 | +127 | |
| 0 1 1 1 1 1 1 0 | +126 | ABSM=1 AREA |
| 0 0 0 0 0 1 0 1 | +5 | |
| 0 0 0 0 0 1 0 0 | +4 | |
| 0 0 0 0 0 0 1 1 | +3 | |
| 0 0 0 0 0 0 1 0 | +2 | |
| 0 0 0 0 0 0 0 1 | +1 | |
| 0 0 0 0 0 0 0 0 | ±0 | ABSM=0 AREA |
| 1 1 1 1 1 1 1 1 | −1 | |
| 1 1 1 1 1 1 1 0 | −2 | |
| 1 1 1 1 1 1 0 1 | −3 | |
| 1 1 1 1 1 1 0 0 | −4 | |
| 1 1 1 1 1 0 1 1 | −5 | |
| 1 1 1 1 1 0 1 0 | −6 | ABSM=1 AREA |
| 1 0 0 0 0 0 0 1 | −127 | |
| 1 0 0 0 0 0 0 0 | −128 | |

FIG. 20

| CWLL | INPUT | | | OUTPUT | |
|---|---|---|---|---|---|
| | CONTROL SIGNAL FROM DSV INTEGRATOR 60 | | | | |
| | CODE (DSVP ABSM DSVM) | DESCRIPTION | CODE | DESCRIPTION | |
| 0 | 0  1  1 | DSV IS A NEGATIVE LARGE VALUE (−5 ≥ DSV) | 1  1  0 | INCREMENT BY MAXIMUM GAIN |
| 0 | 0  0  1 | DSV IS A NEGATIVE SMALL VALUE (−5 < DSV < 0) | 1  0  0 | INCREMENT BY MINIMUM GAIN |
| 0 | 0  0  0 | DSV IS ±0 (DSV = 0) | 0  0  0 | BALANCE |
| 0 | 1  0  0 | DSV IS A POSITIVE SMALL VALUE (0 < DSV < +4) | 0  0  1 | DECREMENT BY MINIMUM GAIN |
| 0 | 1  1  0 | DSV IS A POSITIVE LARGE VALUE (+4 ≤ DSV) | 0  1  1 | DECREMENT BY MAXIMUM GAIN |
| 1 | 0  1  1 | SAME AS WHEN CWLL = 0 | 0  1  1 | DECREMENT BY MAXIMUM GAIN |
| 1 | 0  0  1 | SAME AS WHEN CWLL = 0 | 0  0  1 | DECREMENT BY MINIMUM GAIN |
| 1 | 0  0  0 | SAME AS WHEN CWLL = 0 | 0  0  0 | BALANCE |
| 1 | 1  0  0 | SAME AS WHEN CWLL = 0 | 1  0  0 | INCREMENT BY MINIMUM GAIN |
| 1 | 1  1  0 | SAME AS WHEN CWLL = 0 | 1  1  0 | INCREMENT BY MAXIMUM GAIN |

FIG. 21

| INPUT (14NWD) | OUTPUT | |
|---|---|---|
| ⋮<br>0 0 1 0 0 | 1 0 0 | 14NWD ≧ +4 |
| 0 0 0 1 0 | 0 1 0 | 14NWD = 2 |
| 0 0 0 0 0 | 0 0 1 | 14NWD = 0 |
| 1 1 1 1 0<br>1 1 1 0 0<br>⋮ | 0 0 0 | 14NWD ≦ −2 |

FIG. 22

| 14 NWD | | | INHIBIT MARGIN BITS (1=INHIBITED) | | | | CONTENT OF CONTROL SIGNAL (POLARITY REVERSE TO INTE-GRATOR) | | | OUTPUT (MARGIN BITS) | | | REMARKS |
|---|---|---|---|---|---|---|---|---|---|---|---|---|---|
| 0 | 2 | 4≦ | 001 | 010 | 100 | 000 | + | AB SM | − | 1st out | 2nd out | 3rd out | |
| 0 | 0 | 1 | X | X | X | 0 | X | X | 0 | 0 | 0 | 0 | POSITIVELY MAXIMIZE, POSITIVELY MINIMIZE OR BALANCE 17NWD. INTEGRATOR OUTPUT IS NEGATIVE MAXIMUM, NEGATIVE MINIMUM OR 0. |
| 0 | 0 | 1 | X | X | 0 | 1 | X | X | 0 | 1 | 0 | 0 | |
| 0 | 0 | 1 | X | 0 | 1 | 1 | X | X | 0 | 0 | 1 | 0 | |
| 0 | 0 | 1 | 0 | 1 | 1 | 1 | X | X | 0 | 0 | 0 | 1 | |
| 0 | 0 | 1 | X | X | 0 | X | 0 | 0 | 1 | 1 | 0 | 0 | NEGATIVELY MINIMIZE 17NWD. INTEGRATOR OUTPUT IS POSITIVE MINIMUM. |
| 0 | 0 | 1 | X | 0 | 1 | X | 0 | 0 | 1 | 0 | 1 | 0 | |
| 0 | 0 | 1 | 0 | 1 | 1 | X | 0 | 0 | 1 | 0 | 0 | 1 | |
| 0 | 0 | 1 | 1 | 1 | 1 | 0 | 0 | 0 | 1 | 0 | 0 | 0 | |
| 0 | 0 | 1 | 0 | X | X | X | 0 | 1 | 1 | 0 | 0 | 1 | NEGATIVELY MAXIMIZE 17NWD. INTEGRATOR OUTPUT IS POSITIVE MAXIMUM. |
| 0 | 0 | 1 | 1 | 0 | X | X | 0 | 1 | 1 | 0 | 1 | 0 | |
| 0 | 0 | 1 | 1 | 1 | 0 | X | 0 | 1 | 1 | 1 | 0 | 0 | |
| 0 | 0 | 1 | 1 | 1 | 1 | 0 | 0 | 1 | 1 | 0 | 0 | 0 | |
| 0 | 1 | 0 | X | X | 0 | X | X | X | 0 | 1 | 0 | 0 | POSITIVELY MAXIMIZE, POSITIVELY MINIMIZE OR BALANCE 17NWD. |
| 0 | 1 | 0 | X | 0 | 1 | X | X | X | 0 | 0 | 1 | 0 | |
| 0 | 1 | 0 | X | 1 | 1 | 0 | X | X | 0 | 0 | 0 | 0 | |
| 0 | 1 | 0 | 0 | 1 | 1 | 1 | X | X | 0 | 0 | 0 | 1 | |
| 0 | 1 | 0 | X | X | X | X | 0 | 0 | 1 | 0 | 1 | 0 | NEGATIVELY MINIMIZE 17NWD. |
| 0 | 1 | 0 | X | 1 | X | 0 | 0 | 0 | 1 | 0 | 0 | 0 | |
| 0 | 1 | 0 | 0 | 1 | X | 1 | 0 | 0 | 1 | 0 | 0 | 1 | |
| 0 | 1 | 0 | 1 | 1 | 0 | 1 | 0 | 0 | 1 | 1 | 0 | 0 | |
| 0 | 1 | 0 | 0 | X | X | X | 0 | 1 | 1 | 0 | 0 | 1 | NEGATIVELY MAXIMIZE 17NWD. |
| 0 | 1 | 0 | 1 | 0 | X | X | 0 | 1 | 1 | 0 | 1 | 0 | |
| 0 | 1 | 0 | 1 | 1 | X | 0 | 0 | 1 | 1 | 0 | 0 | 0 | |
| 0 | 1 | 0 | 1 | 1 | 0 | 1 | 0 | 1 | 1 | 1 | 0 | 0 | |
| 1 | 0 | 0 | X | X | 0 | X | 1 | 1 | 0 | 1 | 0 | 0 | POSITIVELY MAXIMIZE 17NWD. |
| 1 | 0 | 0 | X | 0 | 1 | X | 1 | 1 | 0 | 0 | 1 | 0 | |
| 1 | 0 | 0 | 0 | 1 | 1 | X | 1 | 1 | 0 | 0 | 0 | 1 | |
| 1 | 0 | 0 | 1 | 1 | 1 | 0 | 1 | 1 | 0 | 0 | 0 | 0 | |
| 1 | 0 | 0 | X | X | X | X | 1 | 0 | 0 | 0 | 0 | 1 | POSITIVELY MINIMIZE 17NWD. |
| 1 | 0 | 0 | X | 1 | 0 | X | 1 | 0 | 0 | 0 | 1 | 0 | |
| 1 | 0 | 0 | 0 | 1 | 1 | 0 | 1 | 0 | 0 | 0 | 0 | 1 | |
| 1 | 0 | 0 | 1 | 1 | 1 | 0 | 1 | 0 | 0 | 0 | 0 | 0 | |
| 1 | 0 | 0 | X | 0 | X | X | 0 | 0 | 0 | 0 | 1 | 0 | BALANCE 17NWD (SET DSV COMMAND 000 TO 0) |
| 1 | 0 | 0 | 0 | 1 | X | X | 0 | 0 | 0 | 0 | 0 | 1 | |
| 1 | 0 | 0 | 1 | 1 | 0 | X | 0 | 0 | 0 | 1 | 0 | 0 | |
| 1 | 0 | 0 | 1 | 1 | 1 | 0 | 0 | 0 | 0 | 0 | 0 | 0 | |
| 1 | 0 | 0 | X | X | X | 0 | 0 | 0 | 1 | 0 | 0 | 1 | NEGATIVELY MINIMIZE 17NWD. |
| 1 | 0 | 0 | 1 | X | X | 0 | 0 | 0 | 1 | 0 | 0 | 0 | |
| 1 | 0 | 0 | 1 | 0 | X | 1 | 0 | 0 | 1 | 0 | 1 | 0 | |
| 1 | 0 | 0 | 1 | 1 | 0 | 1 | 0 | 0 | 1 | 1 | 0 | 0 | |
| 1 | 0 | 0 | X | X | X | 0 | 0 | 1 | 1 | 0 | 0 | 1 | NEGATIVELY MAXIMIZE 17NWD. |
| 1 | 0 | 0 | 0 | X | X | 1 | 0 | 1 | 1 | 0 | 0 | 1 | |
| 1 | 0 | 0 | 1 | 0 | X | 1 | 0 | 1 | 1 | 0 | 1 | 0 | |
| 1 | 0 | 0 | 1 | 1 | 0 | 1 | 0 | 1 | 1 | 1 | 0 | 0 | |
| 0 | 0 | 0 | X | X | 0 | X | 1 | 1 | 0 | 1 | 0 | 0 | POSITIVELY MAXIMIZE 17NWD (14NWD ≦ −2) |
| 0 | 0 | 0 | X | 0 | 1 | X | 1 | 1 | 0 | 0 | 1 | 0 | |
| 0 | 0 | 0 | 0 | 1 | 1 | X | 1 | 1 | 0 | 0 | 0 | 1 | |
| 0 | 0 | 0 | 1 | 1 | 1 | 0 | 1 | 1 | 0 | 0 | 0 | 0 | |
| 0 | 0 | 0 | 0 | X | X | X | X | 0 | 0 | 0 | 0 | 1 | POSITIVELY MINIMIZE OR BALANCE 17NWD (14NWD ≦ −2) |
| 0 | 0 | 0 | 1 | 0 | X | X | X | 0 | 0 | 0 | 1 | 0 | |
| 0 | 0 | 0 | 1 | 1 | 0 | X | X | 0 | 0 | 1 | 0 | 0 | |
| 0 | 0 | 0 | 1 | 1 | 1 | 0 | X | 0 | 0 | 0 | 0 | 0 | |
| 0 | 0 | 0 | X | X | 0 | X | 0 | X | 1 | 0 | 0 | 1 | NEGATIVELY MINIMIZE OR NEGATIVELY MAXIMIZE 17NWD (14NWD ≦ −2) |
| 0 | 0 | 0 | 0 | X | X | 1 | 0 | X | 1 | 0 | 0 | 1 | |
| 0 | 0 | 0 | 1 | 0 | X | 1 | 0 | X | 1 | 0 | 1 | 0 | |
| 0 | 0 | 0 | 1 | 1 | 0 | 1 | 0 | X | 1 | 1 | 0 | 0 | |

F I G. 23
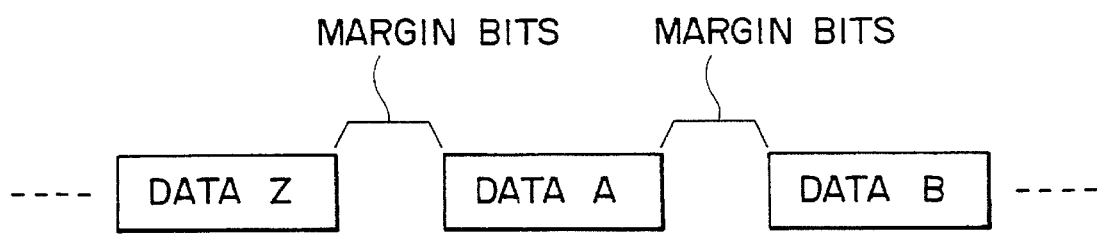

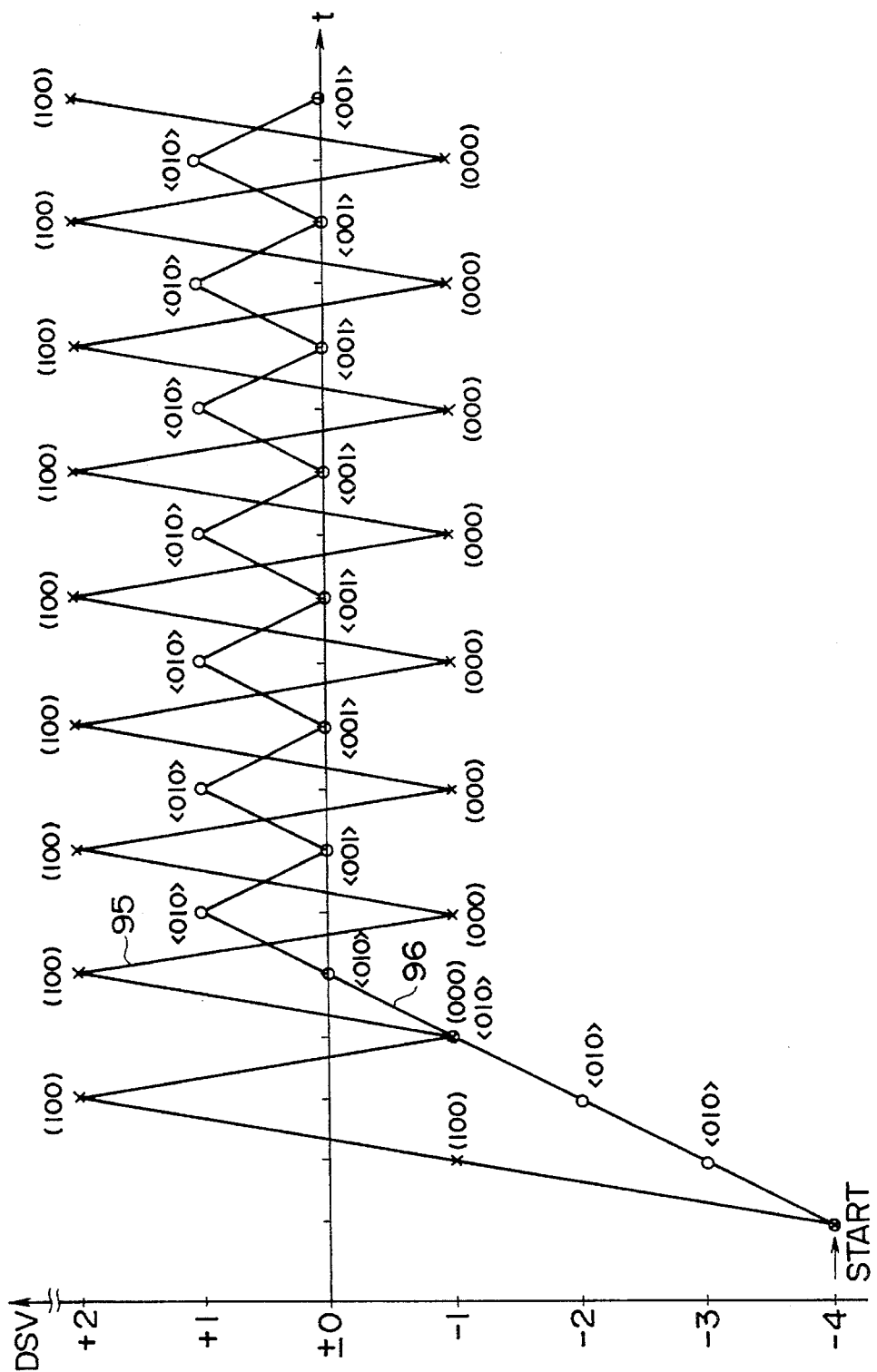

EFM MODULATOR FOR CONTROLLING DIGITAL SUM VARIATION OF ENCODED DATA

BACKGROUND OF THE INVENTION

1. Field of the Invention

The present invention relates to a recording-system modulator for recording a digital audio signal and, more particularly, to a modulator for use on a recording/reproducing apparatus for a write-once type compact disc or a magneto-optical compact disc in controlling a digital sum variation (hereinafter referred to as a DSV) of channel coding.

2. Description of the Prior Art

It is known that, in recording data such as a digital audio signal, the digital signal is added with an error detecting/correcting code and a resultant signal is sent to a modulator to be converted into a code suitable for characteristics of a recording/reproducing system (this conversion is called channel coding).

FIG. 1(A) shows an outline of a signal format based on a compact disc (CD). For modulation, eight-to-fourteen modulation (hereinafter referred to as EFM) is used. In EFM, an input 8-bit code (hereinafter referred to as a symbol) is converted into a 14-channel-bit code, a resultant code is added with a 24-channel-bit synchronizing signal and a 14-channel-bit subcode, and the signal and the subcode are linked together with three channel margin bits to be recorded on an NRZI (Non Return to Zero Inverted) basis.

FIG. 1(B) shows a CD-based frame configuration. As shown, data consisting of 24 symbols (a music signal) and a parity consisting of eight symbols coming from a CIRC (Cross Interleave Reed-Solomon Code) encoder to the modulator in one synchronous frame (six sampled-value divisions, six samples for each of L and R channels, each sample being 16-bit data) period are each converted into blocks each consisting of 14 channel bits. These blocks are linked to each other with a pattern of three channel margin bits. The frame thus consisting of 588 channel bits is recorded on a CD at a bit rate of 4.3218 Mbps on the NRZI basis.

Each of the symbols entered in the modulator is converted into a channel bit pattern having two or more and not greater than 10 "0"s between two consecutive "1"s by referring to a look-up table ROM (Read Only Memory). A channel bit pattern of a frame synchronizing signal Sf is "100000000001000000000010". For a margin bit pattern, one of four patterns "000", "001", "010" and "100" is selected. Referring to FIG. 1(C), one subcoding frame is made up of 98 frames. For subcodes of frame 0 and frame 1, subcode synchronizing signals $S_0$ ("00100000000001") and $S_1$ ("00000000010010") are added respectively.

FIG. 2 shows a channel bit pattern and a DSV obtained after EFM processing with reference to a sampled value by way of example.

A 16-bit sample is divided into upper eight bits and lower eight bits, which are entered in the modulator via the CIRC encoder to be eight-to-fourteen modulated, providing information bits. As mentioned above, there are two or more and not greater than 10 "0"s between two consecutive "1"s in an information bit pattern. For the margin bits, one of "000", "001", "010" and "100" is selected. This rule is always established also at a location linking information bit patterns. Resultantly, an EFM signal on a 17-channel-bit basis (or a 27-channel-bit basis in the case of the frame synchronization signal Sf) is output from the modulator at a bit rate of 4.3218 Mbps.

Since there are two or more and not greater than 10 channel bits "0"s between two consecutive channel bits "1"s as described above, a period (or recording wavelength) of a low level or a high level of an NRZI recording waveform is always 3T or more and less than 11T as shown in FIG. 2.

In this case, a minimum recording wavelength is 3T and a maximum recording wavelength is 11T. T is one period of channel clock 4.3218 MHz. Hereinafter, this is referred to as an EFM 3T-to-11T rule.

Now, DSV (Digital Sum Variation) as an index to a DC balance of the NRZI recording waveform will be defined. The DSV is given as a time integration of a recording waveform. That is, a variation of the DSV obtained when the high level of the recording waveform continues for a unit time T is +1; the variation obtained when the low level of the recording waveform continues for the unit time T is −1.

If an initial value of the DSV at time $t_0$ is zero, then the variation relative to the DSV time is as shown in a bottom of FIG. 2. It should be noted that a modulation signal in a period between $t_1$ and $t_2$ is not determined straight by 17-channel-bit pattern "01000001000001001"; rather, the modulation signal depends on a level of the signal at time $t_1$, that is, a final level of a modulation signal waveform in a period between $t_0$ and $t_1$ (this level is hereinafter referred to as a CWLL).

Accordingly, the CWLL ("Current Word Last Level") of the modulation signal waveform shown is low (CWLL="0") at time $t_0$; a modulation signal waveform whose CWLL="1" (high level) at time $t_0$ has a reverse pattern with the high and low levels replaced with each other.

Likewise, the DSV depends on the CWLL for its increment and decrement. If the CWLL="0" at time $t_0$, a variation amount of the DSV by information bit pattern "01000100100010" (hereinafter referred to as a 14NWD), or a variation amount of the DSV in a period between $t_0$ and $t_{0+14}$ is +2 as shown. Reversely, if the CWLL="1" at time $t_0$, then the 14NWD ("Next Word DSV") is −2. A variation amount a period between $t_{0+14}$ and $t_{1+14}$ is referred to as a 17NWD.

Now, the margin bits to be inserted in a period between $t_{0+14}$ and $t_1$ will be described. Of the four types of margin bits "000", "001", "010" and "100", margin bits "001" and "100" cannot be inserted because of the EFM 3T-to-11T rule. Therefore, "010" or "000" is inserted. That is, let the number of "0"s in an end of an information bit pattern preceding the margin bits be B and the number of "0"s in a beginning of a current information bit pattern be A, then B=1 and A=1, so that the margin bits should start with "0" and end with "0". As a result, a margin bit pattern that can be inserted is "0X0".

Referring again to FIG. 2, the DSV obtained when "010" is inserted as the margin bits is indicated with a solid line, while the DSV obtained when "000" is inserted is indicated with a dashed line.

FIG. 3 shows a prior-art modulator having a margin bit generator. An input terminal 10 receives data with one sync frame consisting of 32 symbols from a data generator, not shown. Each 8-bit symbol is eight-to-fourteen modulated by an EFMROM 11 into 14-bit data.

Frames 0 and 1 of 98 sync frames constituting a subcoding frame are added with 14-bit subcode sync signals $S_0$ and $S_1$ as mentioned above. The addition of these subcode signals is performed by a subcode sync adder 12 based on a subcode sync timing signal, not shown.

A dummy frame sync adder 13 adds a 14-bit dummy frame sync signal S'f (="1XXXXXXXXXXXX10") to a beginning of each sync frame based on a frame sync timing signal, not shown. A bit pattern of a start one bit and end two bits of the dummy frame sync signal S'f is the same as that of the normal 24-bit frame sync signal Sf (= "100000000001000000000010"), the margin bits can be selected in exactly the same processing in which other 14-bit data is processed.

A 14-bit data Dp including the subcode sync signals $S_0$ and $S_1$ and the dummy frame sync signal S'f are sequentially sent to a register 14 to be latched and upper 12 bits are sent to an inhibit margin bit decision circuit 20. At the same time, a last 14-bit data Db hitherto latched in the register 14 are output to a frame sync converter 15 and the inhibit margin bit decision circuit 20 with lower two bits stored in a register 31. Lower two bits stored last, or lower two bits of 14-bit data Dbb before the last are supplied from the register 31 to the inhibit margin bit decision circuit 20.

Current margin bits Mp supplied from a margin bit generator 40 which will be described are stored in a register 32. The 3-bit data stored last, or the margin bits Mb stored last are supplied from the register 32 to the inhibit margin bit decision circuit 20.

Based on upper 12 bits of the current 14-bit data Dp, the last 14-bit data Db, the last margin bits Mb, and the lower two bits of the 14-bit data before the last Dbb, the inhibit margin bit decision circuit 20 determines margin bits which violate the EFM 3T-to-11T rule and an exceptional inhibit rule. If violating bits are found, the decision circuit sends them to the margin bit generator 40 as an inhibit signal Sinh.

The inhibit signal Sinh consists of four bits, each of which corresponds to the four types of margin bits "100", "010", "001" and "000". For example, if the first and third margin bits "100" and "001" are inhibited by the EFM 3T-to-11T rule and the exceptional inhibit rule, the 4-bit inhibit signal Sinh is "1010".

The dummy frame sync adder 13, registers 14, 31 and 32, and inhibit margin bit decision circuit 20 constitute a decision circuit 30.

The decision circuit 30 receives the 14-bit data Dp coming from the subcode sync adder 12 and the margin bits Mp coming from the margin bit generator 40 and outputs the 14-bit data Db stored last to the frame sync converter 15 and the 4-bit inhibit signal to the margin bit generator 40 indicating that the margin bits Mp should not be used to link the last 14-bit data Db and the current 14-bit data Dp.

FIG. 4 shows an algorithm for determining inhibit margin bits. Referring to FIG. 5, the inhibit margin bit decision circuit 20 tests bits shown in shadow selected from among the input signals Dp, Db, Mb and Dbb. According to a test result, the decision circuit 20 determines the margin bits Minh not to be used for linking the last 14-bit data Db with the current 14-bit data Dp, sending the 4-bit inhibit signal Sinh to the margin bit generator 40.

In FIG. 5, an algorithm for determining the inhibit margin bit Minh by the EFM 3T-to-11T rule is as follows:

(1) If the number of "0"s in the beginning of the current 14-bit data Dp and the number of "0"s in the end of the last 14-bit data Db are eight or more in total (A+B≧8), then the margin bit pattern "000" is inhibited (Minh= "000").

(2) If a most significant bit Cl of the current 14-bit data Dp is "1" (A=0) or a next significant bit C2 is "1" (A=1) or the number of "0"s in the end of the last 14-bit data Db is nine (B=9), then the margin bit pattern "001" is inhibited (Minh="001").

(3) If the most significant bit Cl of the current 14-bit data is "1" (A=0) or a least significant bit C14 of the last 14-bit data Db is "1" (B =0), then the margin bit pattern "010" is inhibited (Minh="010").

(4) If the number of "0"s in the end of the current 14-bit data Dp is nine (A=9) or the least significant bit C14 of the last 14-bit data Db is "1" (B =0) or a next least significant bit C13 is "1" (B=1), then the margin bit pattern "100" is inhibited (Minh= "100").

Referring to FIG. 6, an inhibit margin bit pattern which does not violate the EFM 3T-to-11T rule but is inhibited to prevent erroneous generation of a framing sync signal, or an inhibit margin bit pattern to be inhibited by the exceptional inhibit rule is determined as follows:

Case 1: the number of "0"s in the end of the last 14-bit data Db is seven and the frame sync signal is generated in a current timing.

Case 2: the frame sync signal was generated previously and C1 through C6 of the current 14-bit data are "0"s (A=6).

Case 3: B=7 and upper 11 bits of the Dp= "10000000000".

Case 4: lower 13 bits of the Db= "0000000000100" and A=5.

Case 5: B=6 and upper 12 bits of the Dp= "010000000000".

Case 6: lower 12 bits of the Db="000000000010" and A=6.

Case 7: lower 11 bits of the Db="00000000001" and A=7.

Case 8: the margin bit pattern last Mb="000" and Db="00000010000000" and A=1.

Case 9: the least significant bit C14 of the 14-bit data before last Dbb="0" and Mb="000" and Db= "00000010000000".

Case 10: Mb="X00" and Db="00000000100000" and A=2.

In cases 1 through 10, the margin bit pattern "000" is inhibited (Minh="000").

Case 11: if last two bits of Dbb="00" and Mb ="000" and Db="00000100000000", then the margin bit pattern "001" is inhibited (Minh="001").

Referring to FIG. 33, the frame sync converter 15 converts the dummy frame sync signal S'f of sequentially entered 14-bit data into the normal 24-bit frame sync signal Sf based on the frame sync timing, not shown. The 14-bit data other than the dummy frame sync signal are supplied to a P/S (Parallel-in/Serial-out) register 16.

The 24-bit P/S register 16 alternately outputs 14-bit data (or 24-bit data for the frame sync signal Sf) and 3-bit data (margin bits) based on a channel bit clock of 4.3218 MHz.

A serial signal output from the P/S register at a rate of 4.3218 Mbps is NRZI-modulated by an NRZI circuit 17 to be supplied as an EFM signal to a recording head, not shown, or a laser diode, not shown, via a rotary transformer and a recording amplifier, not shown, for example. The EFM signal is then digitally recorded on a CD.

Upon receiving the EFM signal, a DSV integrator 60 integrates a DC component of the EFM signal in units of 17 channel bits. Based on a resultant cumulative DSV, the DSV integrator 60 outputs a 3-bit control signal to the margin bit generator 40. For example, if the cumulative DSV is positive in polarity, the bit pattern "001" instructing decrement (−) of the cumulative DSV is output as the control signal. If the cumulative DSV is zero, the bit pattern "010" instructing balance (0) of the cumulative DSV is output. If the cumulative DSV is negative in polarity, the bit pattern "100" instructing increment (+) of the cumulative DSV is output.

Referring again to FIG. 4, the margin bit generator 40 operates as follows. This circuit outputs a most suitable margin bit pattern of the four types the margin bit patterns "100", "010", "001" and "000". The most suitable bit pattern denotes that, when the two pieces of 14-bit data Db and Dp are linked together with this margin bit pattern, the EFM 3T-to-11T rule is also established at the link, no erroneous generation of the frame sync signal occurs, and the cumulative DSV of the EFM signal converges to zero.

The margin bit generator 40 does not test each margin bit pattern individually for determining the most suitable one; rather, this circuit determines the most suitable pattern from the beginning based on conditions such as the bit patterns of the two pieces of 14-bit data and the cumulative DSV. Input signals to the margin bit generator 40 are as follows.

First, a 4-bit inhibit signal Sinh comes from the inhibit margin bit decision circuit 20. If a margin bit pattern violating the EFM 3T-to-11T rule is found or a margin bit pattern which cannot be inserted between the two pieces of 14-bit data Db and Dp because the pattern will erroneously generate the frame sync signal is found, such a pattern is disabled by setting a bit of the inhibit signal corresponding to the margin bit to "1". For example, of the four margin bit patterns "100", "010", "001" and "000", if the first and third patterns are disabled, the 4-bit inhibit signal will be "1010".

Next, a 3-bit control signal is entered in the margin bit generator 40 from the DSV integrator 60 according to the cumulative DSV. This 3-bit control signal indicates, from the most significant bit to the least significant bit, that a desired control direction of the cumulative DSV is increment (+), balance (0), and decrement (−). Accordingly, if the cumulative DSV is greater than zero, this control signal is "001" to instruct decrement of the cumulative DSV; if the cumulative DSV is smaller than zero, the control signal is "100" to instruct increment of the cumulative DSV; and if the cumulative DSV is equal to zero, the control signal is "010" to instruct to balance the cumulative DSV as far as possible.

Then, a 5-bit 14NWD signal and a 1-bit CWLL signal are entered in the margin bit generator 40.

FIG. 7 shows an example of NRZI waveforms of the two pieces of 14-bit data Db and Dp to be linked together by the margin bits.

A variation of the cumulative DSV caused by adding the margin bits to the last 14-bit data Db, or a DC component of the margin bits (hereinafter referred to as the DSV of the margin bits) is represented with reference to a low level ("0") of a signal level, or the CWLL of an NRZI waveform at a start of the margin bits.

That is, as shown in FIGS. 7(A) through (D), the DSV of the first margin bit pattern "100" is +3, that of the second margin bit pattern "010" is +1, that of the third margin bit pattern "001" is −1, and that of the fourth margin bit pattern "000" is −3. If the CWLL ="1" (high level), the signs of these DSV values are inverted.

Likewise, a variation of the cumulative DSV caused by adding the current 14-bit data Dp, or a DC component, or the 14 NWD of the 14-bit data Dp is represented with reference to a low level of a signal level of an NRZI waveform at a start of the 14-bit data Dp. That is, the 14NWD of the 14-bit data Dp (= "00100100000100") is −2.

A variation of the cumulative DSV caused by linking the 14-bit data Db with following 14-bit data Dp by using 3-bit margin bit pattern, or the 17NWD is obtained by subtracting the 14NWD from the DSV of margin bits for the first, second or third margin bit pattern; for the fourth margin bit pattern ("000"), the variation is obtained by adding the 14NWD to the DSV of margin bits.

FIG. 8 shows a monograph for obtaining the 17NWD from the 14NWD when the CWLL="0" (low level). FIG. 9 shows a monograph for obtaining the 17NWD from the 14NWD when the CWLL="1".

In FIG. 8, each of (A), (B), (C) and (D) indicates the 17NWD corresponding to each of the four margin bit patters "100", "010", "001" and "000" to be inserted.

Now, referring to FIG. 8, a case in which the 14NWD of next 14-bit data Dp is 3 or more for example will be considered.

First, if the cumulative DSV so far is zero or negative in value, a next 17NWD is made zero or positive in value to increment the cumulative DSV toward zero. In the case of 14NWD≧3, a margin bit pattern that provides 17NWD≧0 is only "000". Therefore, this bit pattern is given a first priority.

If the EFM 3T-to-11T rule or the exceptional inhibit rule prevents insertion of the margin bit pattern of the first priority "000" then the margin bit pattern "100" is given a second priority, the margin bit pattern "101" is given a third priority, and the margin bit pattern "001" is given a fourth priority. Thus, even if CWLL=0, the most suitable margin bit pattern in the case where the 14NWD≧3 can be determined straightforwardly. This makes it unnecessary to test all of the four margin bit patterns individually.

Likewise, if the 14NWD≧3 and the cumulative DSV so far is positive in value, the next 17NWD is made negative to decrement the cumulative DSV. In this case, the margin bit patterns "010", "001", "100" and "000" are prioritized in this order, the most suitable margin bit pattern can be determined straightforwardly.

Similarly, for each of cases where 14NWD=2, 14NWD= 1, 14NWD=0 and 14NWD≧−1, the four types of the margin bit patterns are prioritized logically.

Referring to FIG. 9, where CWLL="1" (high level), the margin bit patterns are prioritized for each of five cases in which the 14NWD of the next 14-bit data Dp is +3 or more, +2, +1, 0 and −1 or less. However, as is clearly seen from comparison between CWLL="0" of FIG. 8 and CWLL="1" of FIG. 9, both flags are symmetrical to each other with an x-axis (indicating the 14NWD) in between. Therefore, inverting a sign of an y-axis (indicating the 17NWD) makes the monograph of FIG. 9 be the same as the monograph of FIG. 8. That is, if CWLL="1", converting the 3-bit control signal from "100" (incrementing the cumulative DSV) to "001" (decrementing the cumulative DSV) or from "001" to "100" allows to apply the algorithm of determining the most suitable margin bit pattern in the case where CWLL="1" without change.

In the margin bit generator 40 of FIG. 4, reference numeral 41 represents a decoder which decodes the 3-bit control signal with the CWLL signals used as gate signals. A truth table of the decoding is shown in FIG. 10(A).

Reference numeral 42 represents a decoder for converting the 14NWD represented in a 5-bit two's complement to a 4-bit signal indicating the above-mentioned five cases. A truth table of the decoding is shown in FIG. 10(B).

Reference numeral 43 represents a programmable logic array (PLA) programmed so that it receives the 4-bit inhibit signal from the inhibit margin bit decision circuit 20, the 3-bit control signal from the decoder 41, and 4-bit signal from the decoder 42 to output a most suitable margin bit pattern 44. Of truth tables programmed in the PLA 43, 52-term truth tables obtained when CWLL="0" are shown in FIGS. 11(A) and 11(B).

In FIGS. 11(A) and 11(B), "1" indicates a condition established and "0" indicates a condition not established "X" indicates "don't care," that is, a condition may be or may not be established. For example, top four rows (terms) of the truth table of FIG. 11(A) denote as follows.

If CWLL=0 and the control signal="XX0" (at least not a decrement instruction), and if 14NWD≧3, then the margin bit patterns "000", "100", "010" and "001" are prioritized in this order. That is, if the margin bit pattern "000" of the first priority is not inhibited (the inhibit signal="XXX0"), this pattern is output as the most suitable margin bit pattern. If the margin bit pattern "000" of the first priority is inhibited and the margin bit pattern "100" of the second priority is not inhibited (the inhibit signal="XX01"), then the margin bit pattern "100" of the second priority is output as the most suitable margin bit pattern.

If both the margin bit patterns of the first and second priorities are inhibited and the margin bit pattern of the third priority is not inhibited (the inhibit signal="X011"), then the margin bit pattern ("010") of the third priority is output as the most suitable margin bit pattern. If all of the margin bit patterns of the first, second and third priorities are inhibited (the inhibit signal="0111"), then the margin bit "001" of the fourth priority is output.

Thus, without testing each margin bit pattern individually, the most suitable margin bit pattern 44 logically determined by the PLA 43 is output.

Consequently, the conventional modulator controls the margin bit patterns only based on the DSV polarities by a certain gain without monitoring a DSV absolute value. This causes a poor convergence when the DSV absolute value is large. When the DSV absolute value is small, an extra gain is added to make the DSV unstable.

On the other hand, an amplitude of a signal read from a disc on a mini-disc system is as small as about 1/30 of that of a signal read from a full-size compact disc, requiring proper control of the DSV. This requirement has not been fully satisfied due to the above-mentioned problem.

OBJECTS AND SUMMARY OF THE INVENTION

It is therefore an object of the present invention to monitor a DSV absolute value to generate a margin bit pattern having a proper gain, thereby improving the convergence of the DSV.

In carrying out the invention and according to one aspect thereof, there is provided a modulator in which an input M-bit code series is converted into N channel bit patterns (where N>M) to be linked to each other with one of multiple types of margin bit patterns to control maximum and minimum recording wavelengths and suppress a low-frequency component of a recording waveform. The above-mentioned modulator comprises margin bit generating means which receives a signal concerning a margin bit pattern to be inhibited, a signal concerning a final recording waveform level of each of the N channel bit patterns preceding the margin bit pattern, a control signal concerning a polarity of cumulative DSV, a control signal for switching between gains by detecting an absolute value of the DSV, and a signal concerning the DSV of each of the N channel bit patterns succeeding the margin bit pattern, thereby generating a most suitable margin bit pattern of the above-mentioned multiple bit patterns.

Following four types of signals are entered in a margin bit generator.

(1) A 4-bit inhibit signal (Sinh) comes from an inhibit margin bit decision circuit. This signal sets an inhibit flag "1" to any of margin bit patterns "100", "010", "001" and "000" that violate the EFM 3T-to-11T rule and any of the margin bit patterns that generates a frame sync pattern when margin bits are added to data.

(2) Following 3-bit control signals come from a DSV integrator. Each of these control signals consists of a 1-bit signal (DSVP) for indicating that cumulative DSV has a positive polarity, a 1-bit signal (ABSM) for instructing a maximum gain or a minimum gain (magnitude of power), and a 1-bit signal (DSVM) for indicating that cumulative DSV has a negative polarity. Combinations of these 1-bit signals provide following control signals for example:

control signal 000: set the DSV to zero;

control signal 001: direct the DSV in negative direction with minimum gain;

control signal 011: direct the DSV in negative direction with maximum gain;

control signal 100: direct the DSV in positive direction with minimum gain; and control signal 110: direct the DSV in positive direction with maximum gain.

(3) A 1-bit signal indicating a final signal level of an NRZI waveform of 14-bit data Db preceding a margin bit pattern. When the CWLL is low, this signal is "0"; when the CWLL is high, this signal is "1".

(4) A 5-bit signal for representing the DSV of 14-bit data Dp succeeding a margin bit pattern in a two's complement.

The bits in the 4-bit inhibit signal correspond, from a most significant bit to a least significant bit, to the margin bit patterns "001", "010", "100" and "000" for example. Flag "1" is set to any of the margin bit patterns that violates the EFM 3T-to-11T rule and/or erroneously generates a frame sync.

For example, if the number of "0"s in the end of the 14-bit data Db preceding a margin bit pattern is four (B=4) and the number of "0"s in the beginning of 14-bit data Dp succeeding the margin bit pattern is five (A=5), then the margin bit pattern "000" is inhibited by the EFM 3T-to-11T rule and the 4-bit inhibit signal "0001" is sent from the inhibit margin bit decision circuit to a programmable logic array (PLA).

The above-mentioned 3-bit control signal coming from the DSV integrator is sent to the PLA via a decoder which uses the CWLL signal as a gate signal.

The decoder, based on CWLL and DSV polarities, converts the 3-bit control signal and sends a resultant signal to the PLA so that the PLA outputs the most suitable margin bit pattern.

That is, if CWLL="1" and the input control signal is "1X0" (instructing a maximum gain when X=1, a minimum gain when X=0) when the cumulative DSV is positive, the control signal is output without change ("1X0"); if the input control signal is "0X1" (instructing a maximum gain when X=1, a minimum gain when X=0) when the cumulative DSV is negative, the control signal is output without change ("0X1").

The DSV of the 14-bit data Dp, or a variation (14NWD) of cumulative DSV resulted from adding the 14-bit data Dp to the end of a margin bit pattern is represented in a 5-bit two's complement and is entered as a 14NWD signal in a decoder to be decoded into one of four cases that follow:

(1) if 14NWD≧4, then the 3-bit signal "100" is output from the decoder to the PLA;

(2) if 14NWD=2, then the 3-bit signal "010" is output from the decoder to the PLA;

(3) if 14NWD=0, then the 3-bit signal "001" is output from the decoder to the PLA; and (4) if 14NWD<0, then the 3-bit signal "000" is output from the decoder to the PLA.

The PLA outputs the most suitable margin bit pattern based on combinations of the input signals consisting of a total of 10 bits (the 4-bit signal indicating an inhibit margin bit pattern, the 3-bit control signal instructing control direction of the cumulative DSV and its gain, and 3-bit signal indicating one of the four cases of 14NWD).

BRIEF DESCRIPTION OF THE DRAWINGS

The above and other objects, features and advantages of the present invention will become more apparent from the following description taken in connection with the accompanying drawings, in which:

FIG. 1(A) shows an outline of a CD-based signal format;

FIG. 1(B) is a diagram illustrating a CD-based frame configuration;

FIG. 1(C) is a diagram illustrating a CD-based subcoding frame configuration;

FIGS. 3(A) and 3(B) show a block diagram illustrating a prior-art modulator;

Figure 5:
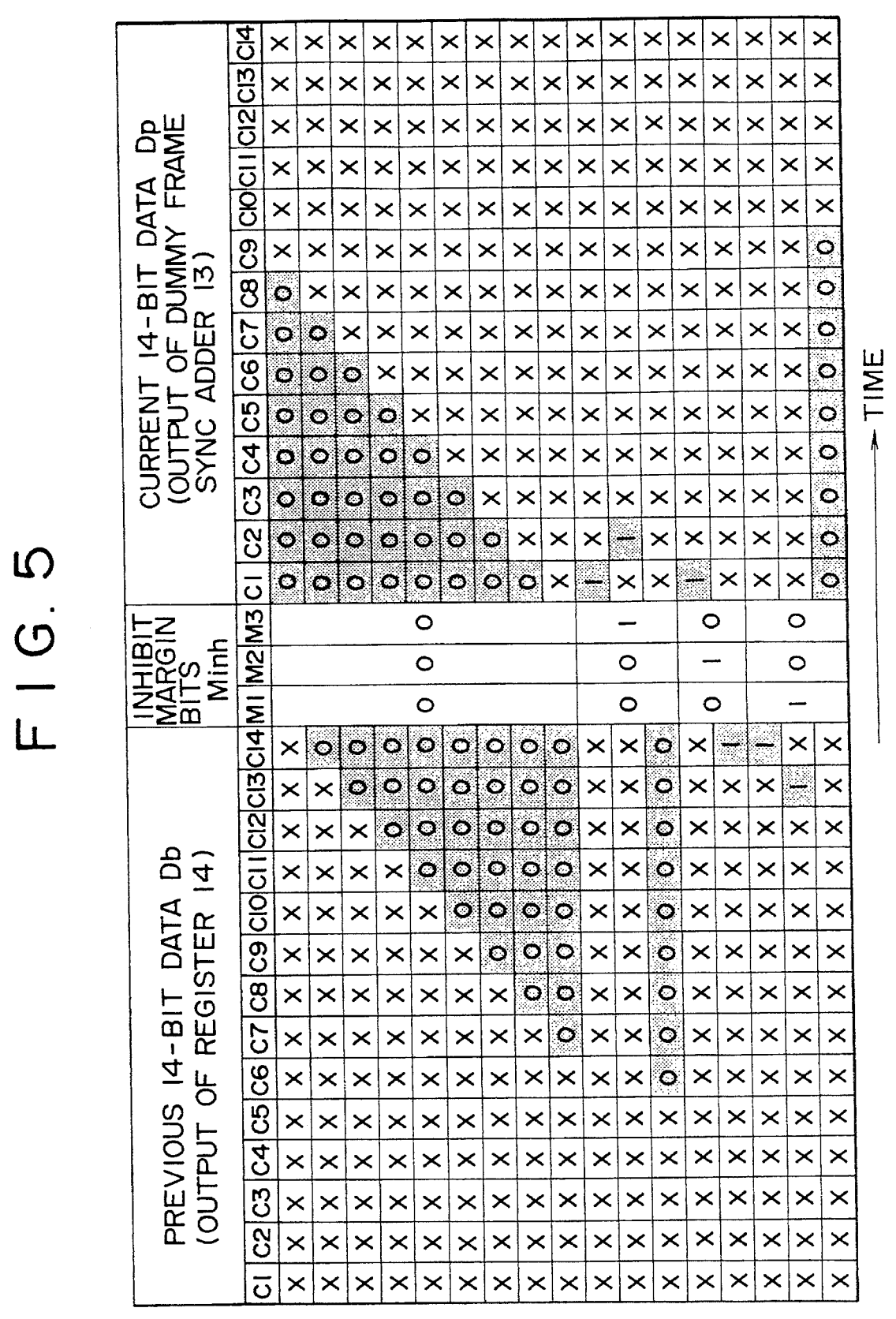

FIG. 5 is a diagram illustrating a margin bit inhibit operation;

Figure 6:
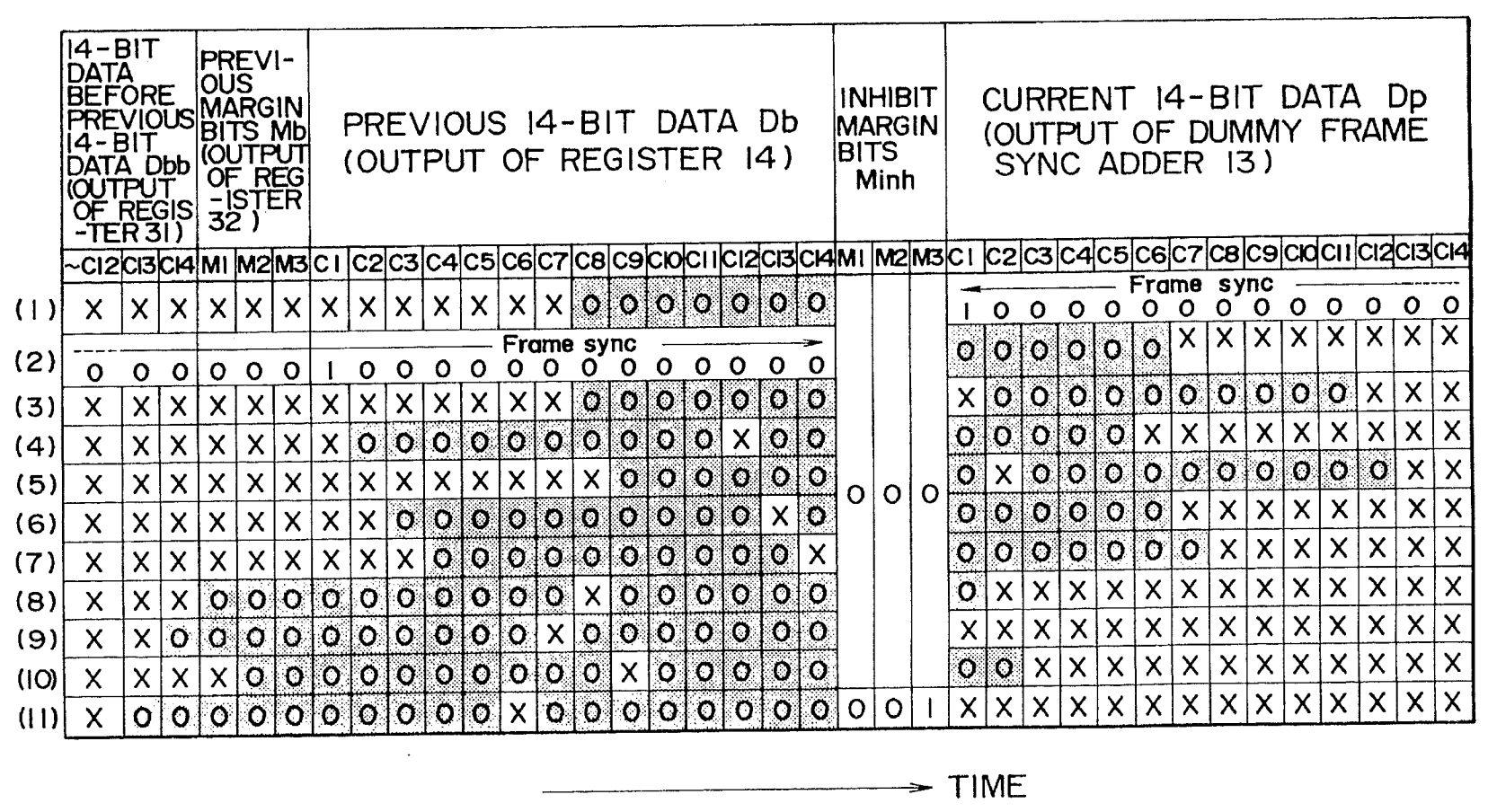

FIG. 6 is a diagram illustrating a margin bit exceptional inhibit operation;

FIG. 10(A) is a truth table for describing an operation of a prior-art decoder 41;

FIG. 10(B) is a truth table for describing an operation of a prior-art decoder 42;

FIG. 11(A) is a truth table for describing an operation of a prior-art PLA 43;

FIG. 11(B) is a truth table for describing an operation of the prior-art PLA 43;

FIG. 12 is a diagram for describing how a margin bit pattern is determined;

FIG. 14 is a diagram for describing how a margin bit pattern is determined;

FIG. 19 is a diagram describing an operation of the DSV integrator of FIG. 18;

FIG. 20 is a truth table describing an operation of a decoder 41A practiced as a preferred embodiment of the invention;

FIG. 21 is a truth table describing an operation of a decoder 42A practiced as a preferred embodiment of the invention;

FIG. 22 is a truth table describing an operation of a PLA 43A practiced as a preferred embodiment of the invention;

FIG. 23 is a diagram for describing how margin bits are added;

FIG. 25 is a diagram illustrating a difference in stability between the locus of the DSV according to the invention and the locus obtained on the prior-art counterpart.

DESCRIPTION OF THE PREFERRED EMBODIMENTS

Figures 13, 13A:
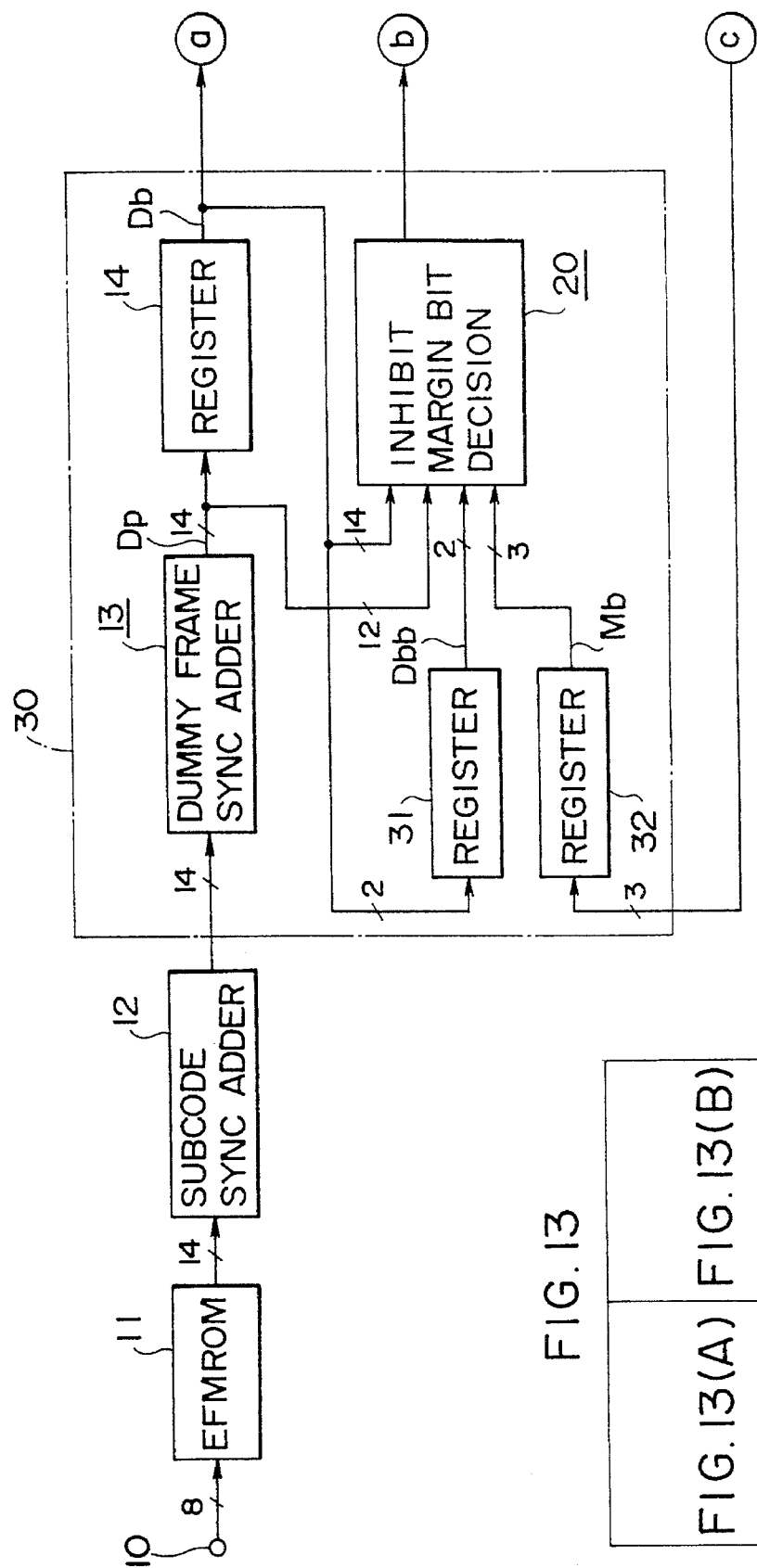
FIGS. 13(A) and 13(B) show a block diagram illustrating a modulator practiced as a preferred embodiment of the invention.

This invention will be described in further detail by way of example with reference to the accompanying drawings. It should be noted that a basic constitution of a modulator practiced as a preferred embodiment of the invention as shown in FIGS. 13(A) and 13(B) is generally the same as that of FIGS. 3(A) and 3(B), so that the description will be made omitting overlapping portions between them.

Figure 2:
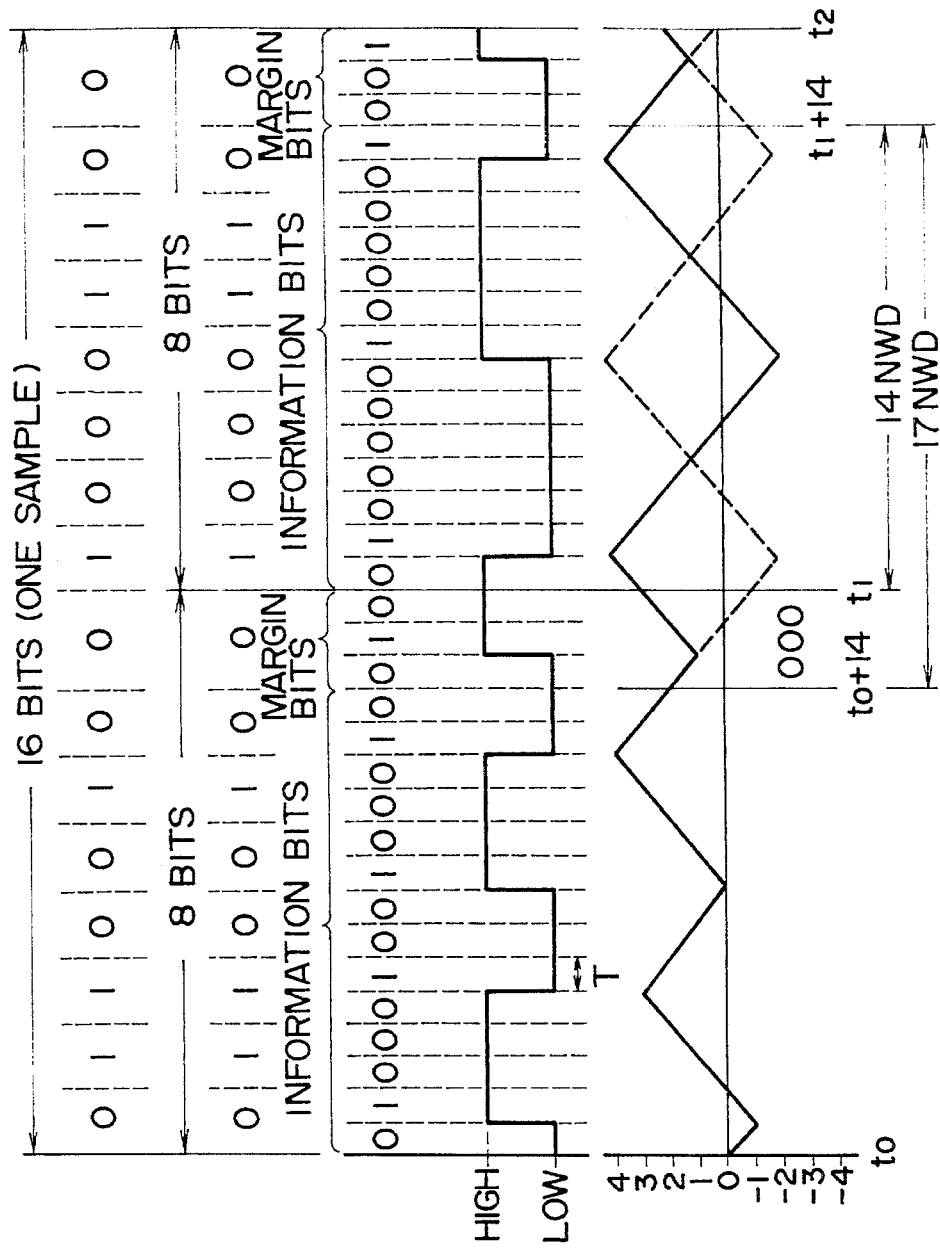
FIG. 2 is a diagram illustrating a relationship between a sampled value and an EFM signal.
Figure 3B:
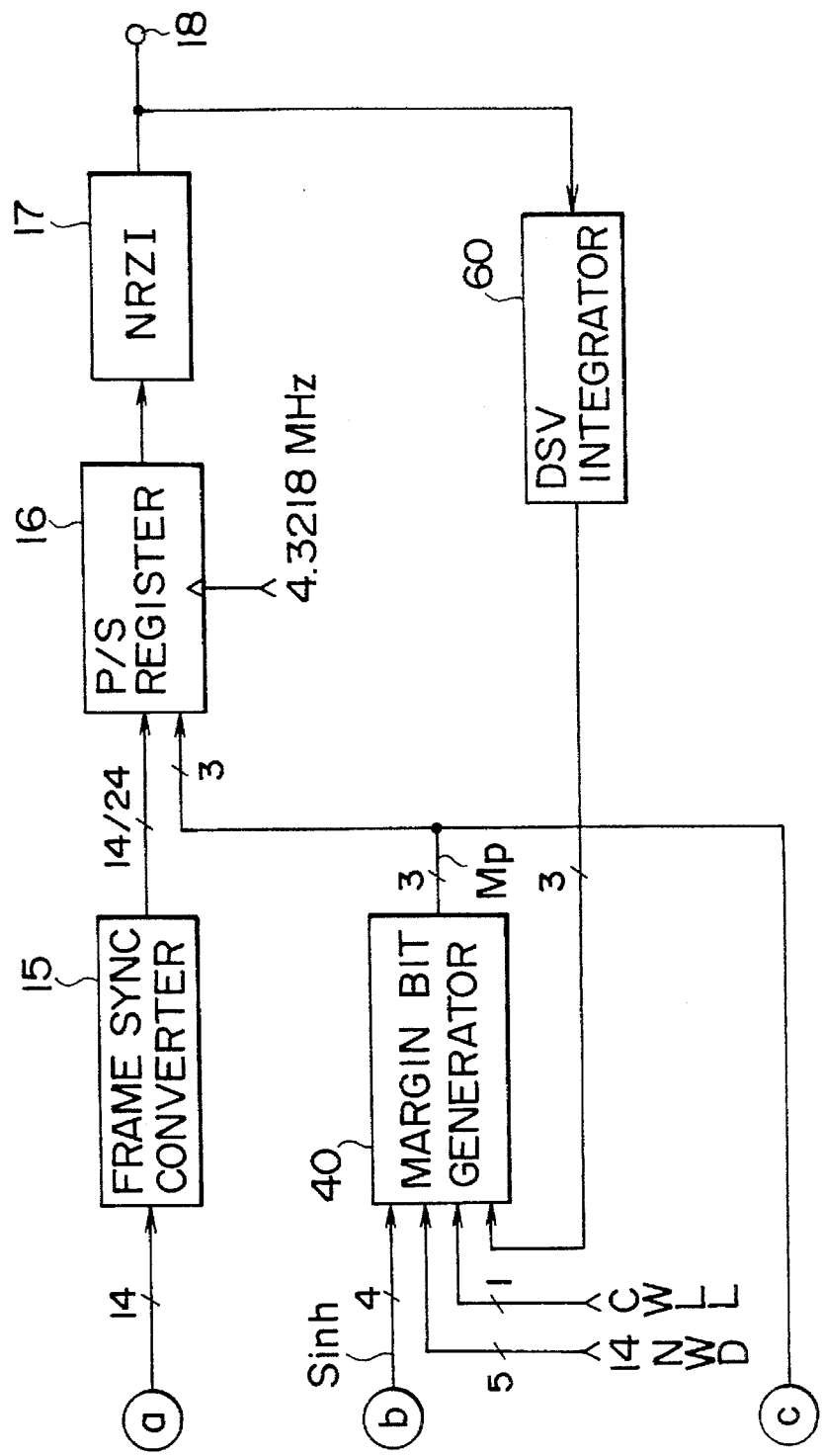
Figure 4:
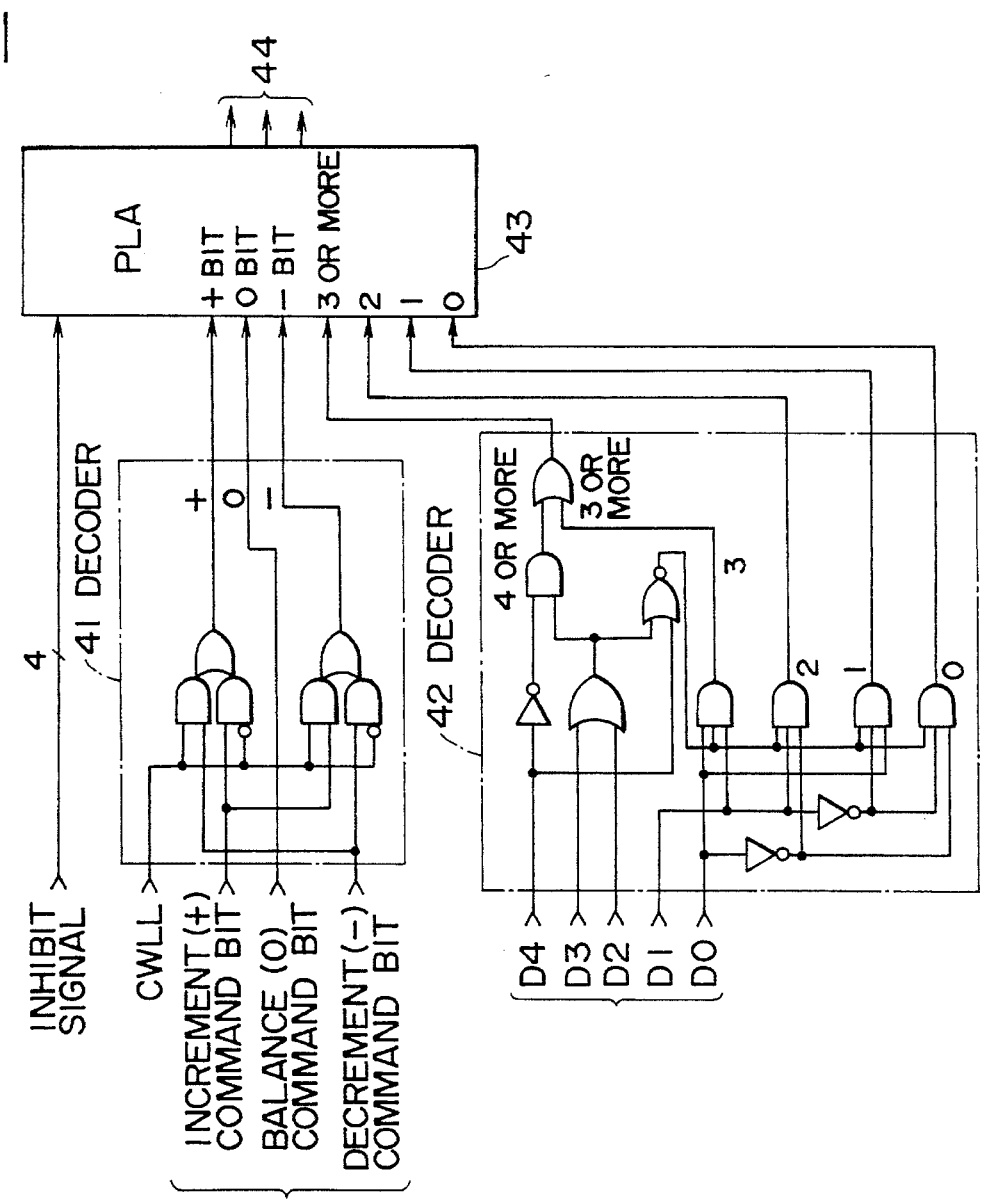
FIG. 4 is a block diagram illustrating a prior-art margin bit generator.
Figure 7:
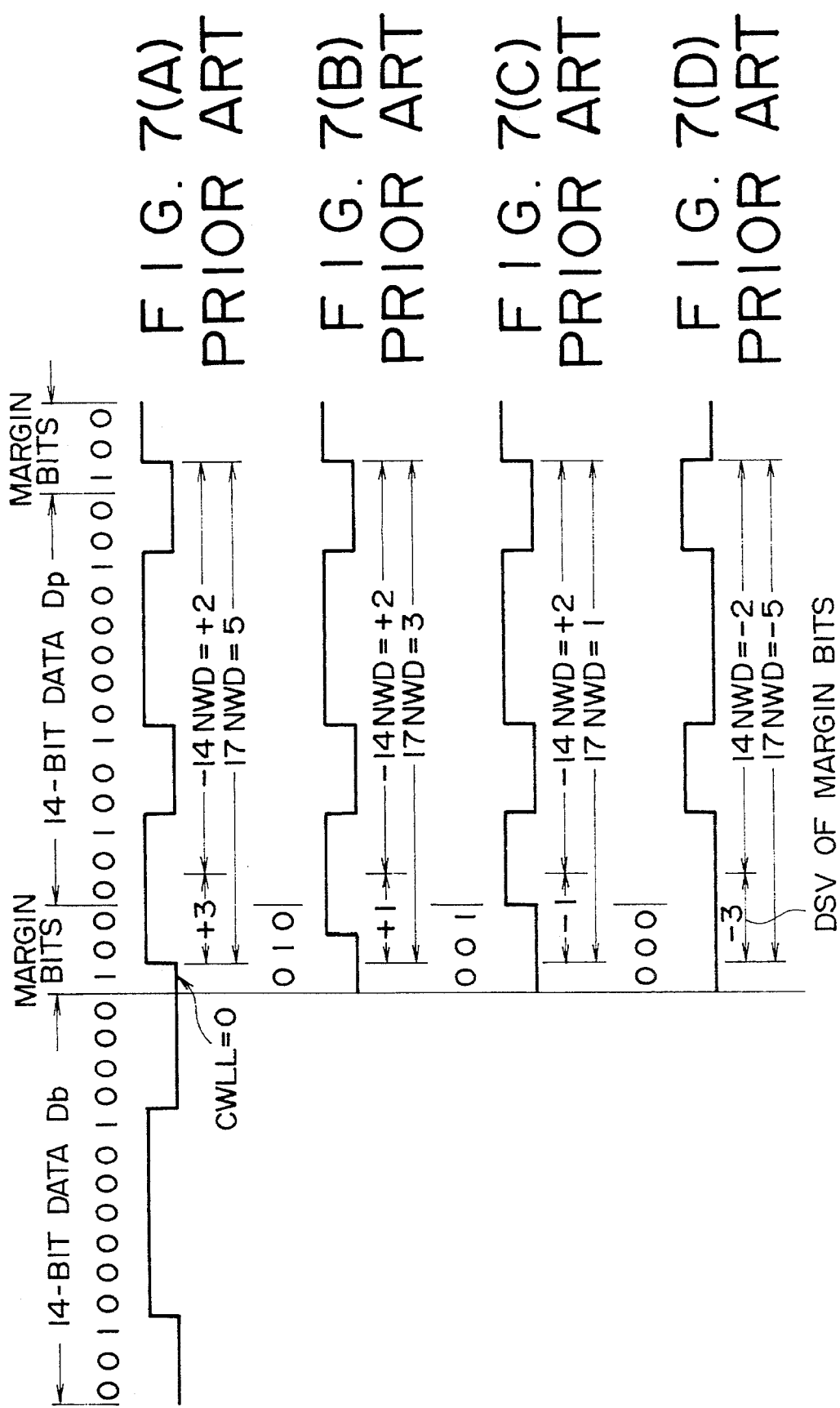
FIGS. 7(A) to 7(D) show a diagram illustrating a prior-art EFM signal waveform.
Figure 8:
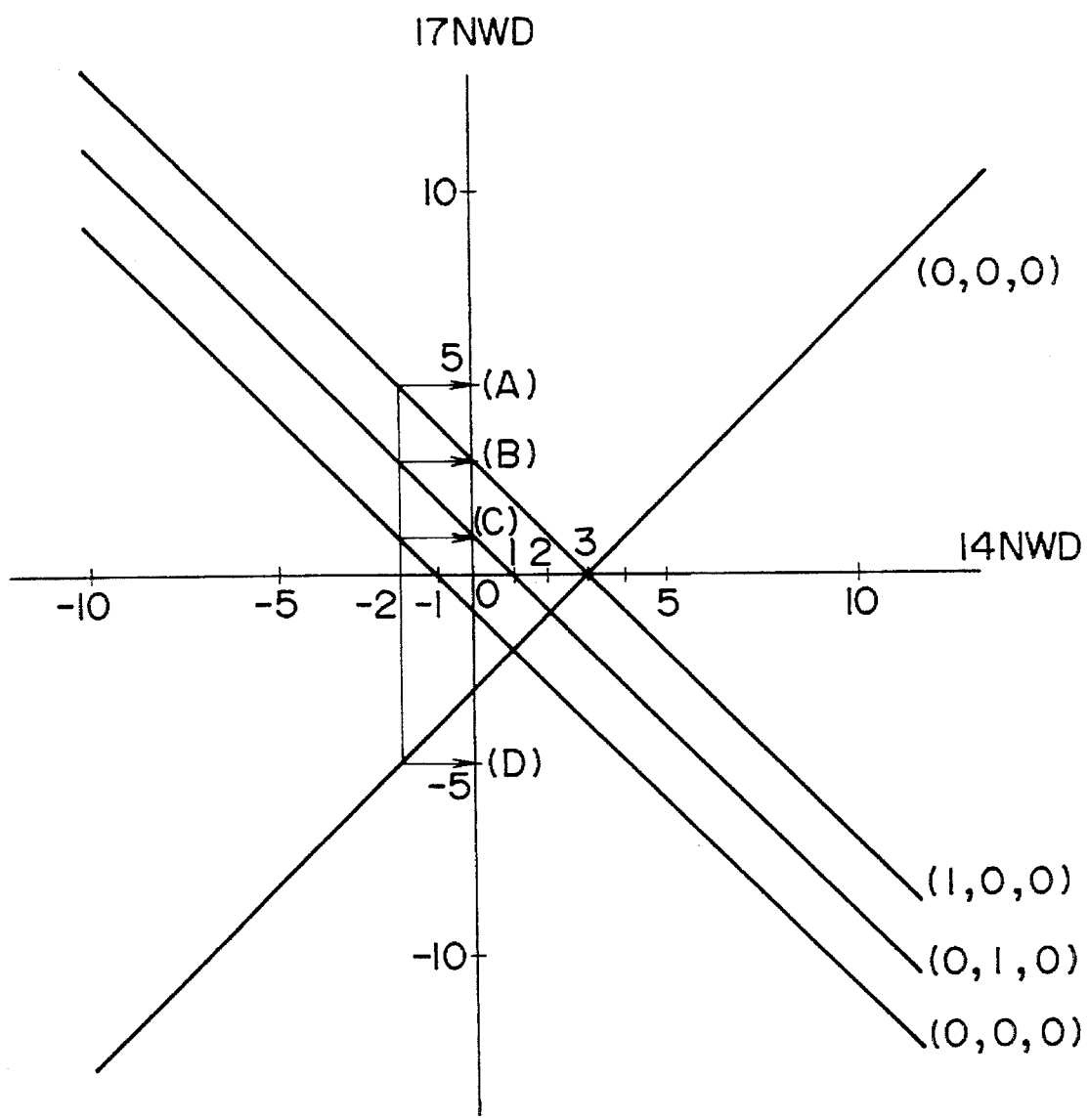
FIG. 8 is a monograph for obtaining 17NWD from 14NWD when CWLL is "0"
Figure 9:
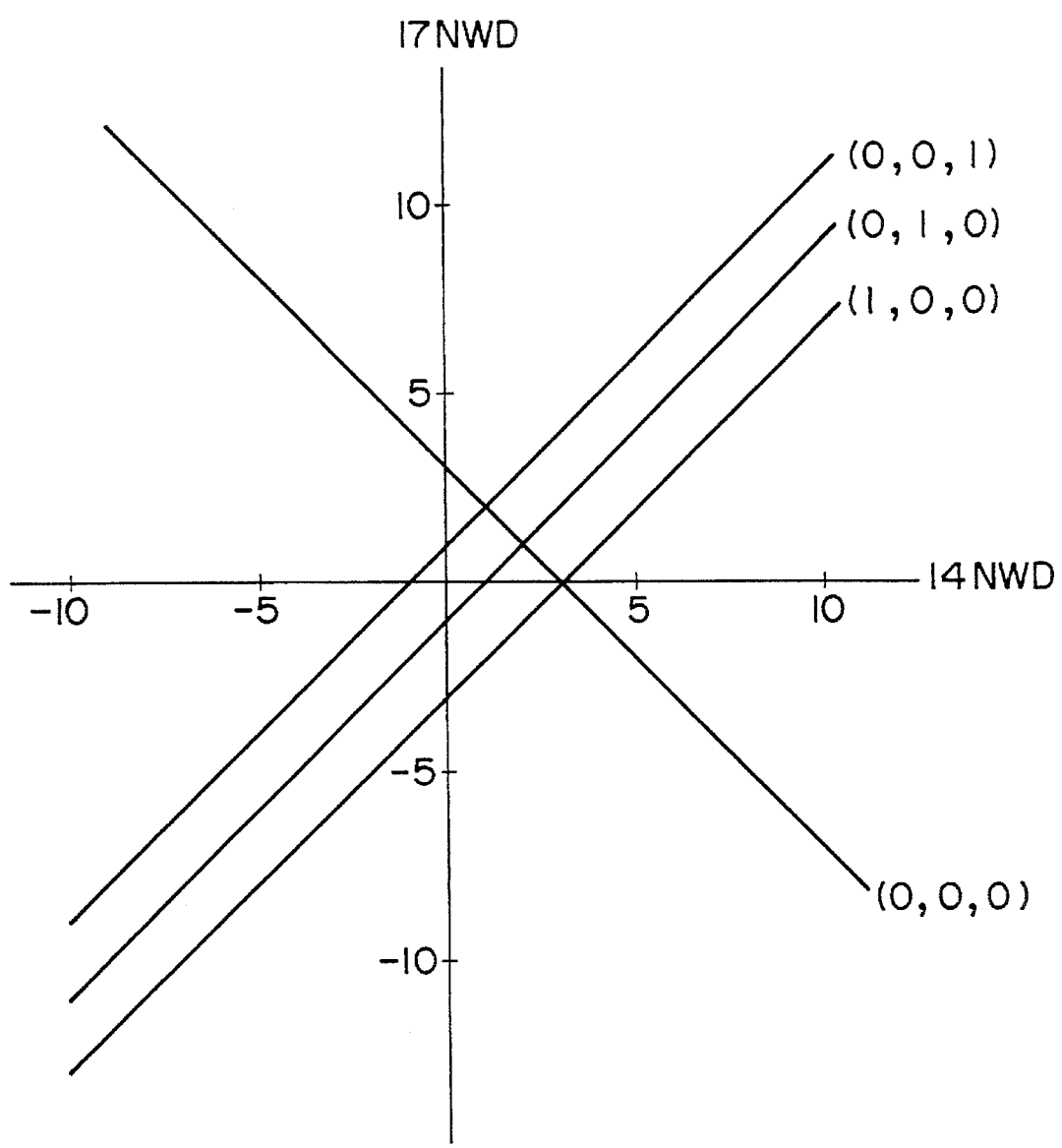
FIG. 9 is a monograph for obtaining 17NWD from 14NWD when CWLL is "1"
Figure 13B:
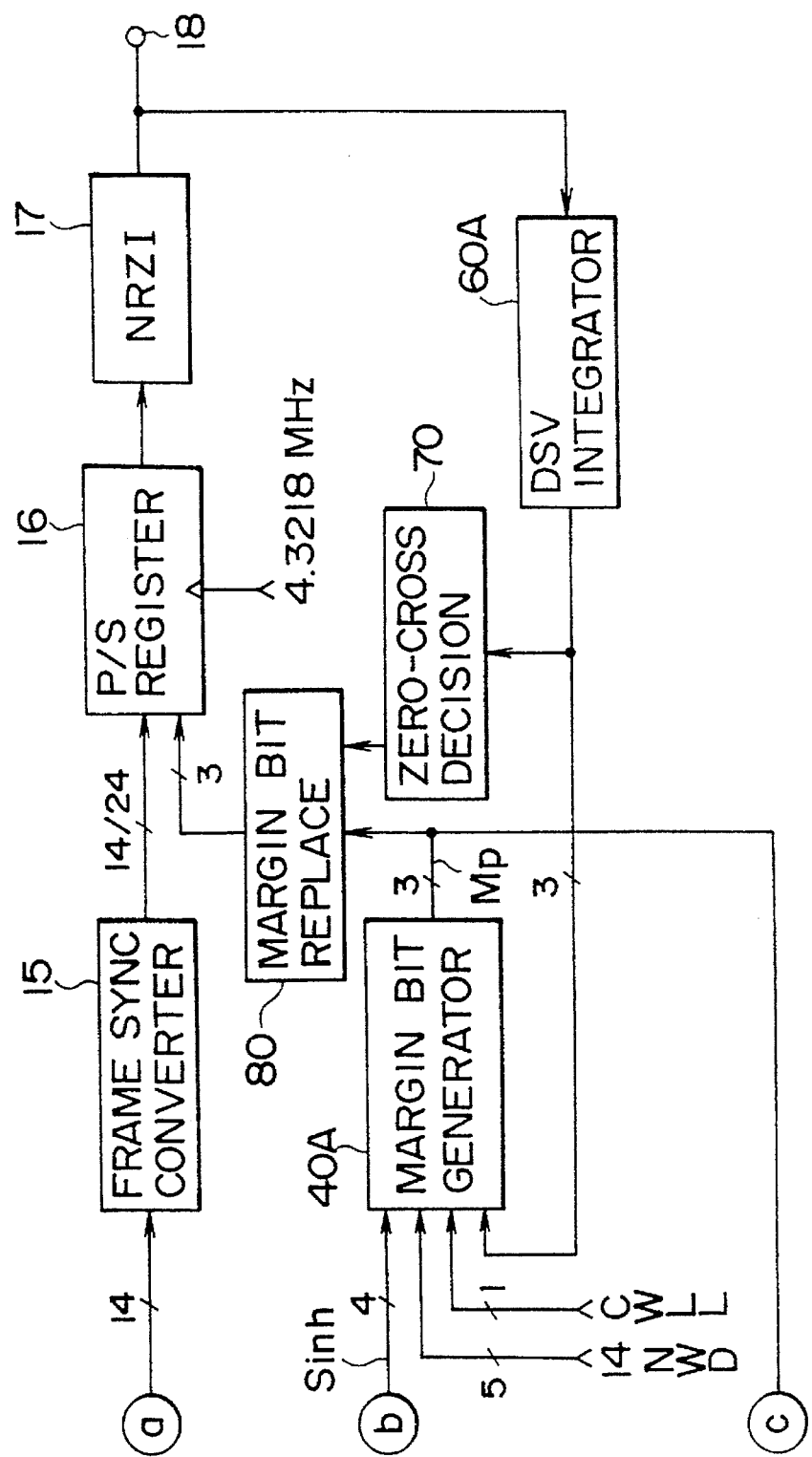
Figure 15:
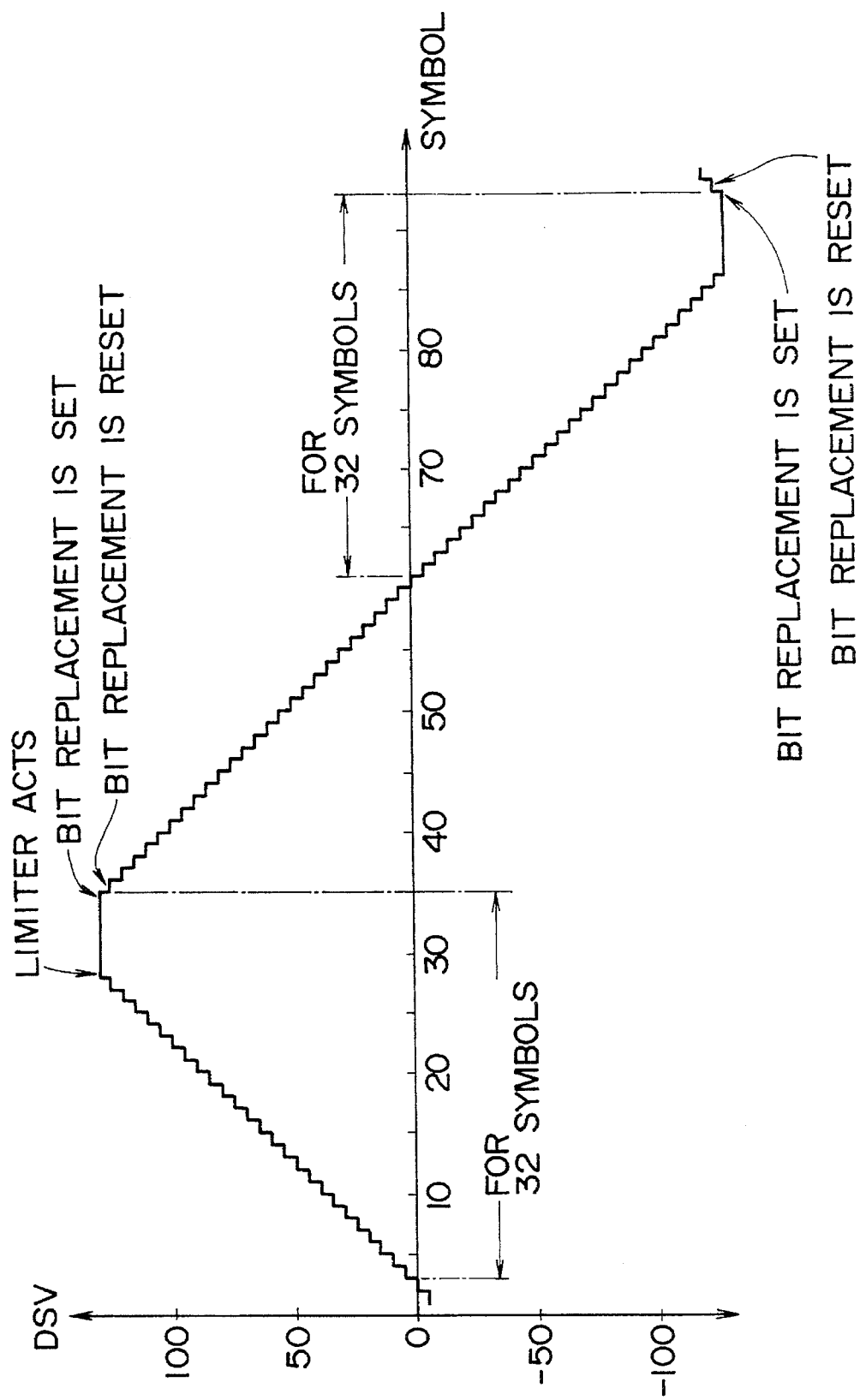
FIG. 15 is a diagram for describing a margin bit replacement operation.

In the present invention, a DSV integrator 60A in FIG. 13B operates differently from a prior-art DSV integrator 60 of FIG. 3B. Further, unlike a prior-art circuit, the invention is added with a decision circuit 70 for determining a zero-cross point of a DSV integrated value and a margin bit replacing circuit 80.

Referring to FIG. 13(B), a serial signal, having been NRZI-converted by an NRZI circuit 17, is output from the novel modulator at a rate of 4.3218 Mbps as an EFM signal to a recording head or a laser diode, both not shown, via a rotary transformer and a recording amplifier, both not shown, for example, to be eventually recorded on a compact disc (CD) in a digital manner.

Having received the EFM signal, the DSV integrator 60A integrates a DC component of the signal in units of 17 channel bits. In the present invention:

(1) if this cumulative DSV is positive in polarity and large in absolute value (to be specific, +4≦DSV), a control signal "011" is output to instruct decrement (−) by a maximum gain of the cumulative DSV;

(2) if this cumulative DSV is positive in polarity and small in absolute value (to be specific, 0<DSV<4), a control signal "001" is output to instruct decrement (−) by a minimum gain of the cumulative DSV;

(3) if this cumulative DSV is zero, a control signal "000" is output to instruct to make the cumulative DSV change as little as possible; and (4) if this cumulative DSV is negative in polarity and large in absolute value (to be specific, DSV≦−5), a control signal "110" is output to instruct increment (+) by the maximum gain of the cumulative DSV; and (5) if this cumulative DSV is negative in polarity and small in absolute value (to be specific, 0>DSV>−5), a control signal "100" is output to instruction increment (+) by the minimum gain of the cumulative DSV.

Now, suppose that the cumulative DSV cannot be directed as desired due to reasons such as presence of an inhibit margin bit pattern. If the cumulative DSV is positive, its absolute value gets larger and larger because a margin bit pattern to put the cumulative DSV in a negative direction cannot be selected, eventually causing the DSV integrator to overflow (actually, a decoder or an overflow limiter 63 of FIG. 18 operates).

Before such a situation occurs, it is necessary to replace a most suitable margin bit pattern 44A output from the PLA 43A within a range permitted by the inhibit margin bit pattern, or by the EFM 3T-to-11T rule. A margin bit replacing circuit 80 is provided for this purpose.

How the cumulative DSV changes as a result of replacing the most suitable margin bit pattern 44A with another margin bit pattern will be described by way of example by supposing a fixed-pattern input for convenience of the description.

Referring to FIG. 13A, suppose that data having a pattern "10010011" enters in a terminal 10. The data is converted by an EFMROM 11 into a 14-bit pattern "00100000100001". If this pattern comes one after another continuously, a margin bit pattern "001" or "000" of FIG. 12 is selected for an inhibit margin bit pattern by the EFM 3T-to-11T rule.

If the cumulative DSV is negative (regardless of a magnitude of its absolute value) and the CWLL is low, "001" is output from the PLA 43A as the most suitable margin bit pattern because the 14NWD of this data is ±0. Hence, in this case, the 17NWD is −1 as shown in FIG. 14.

Since the cumulative DSV is negative, it cannot be put in a desired direction as long as the above-mentioned fixed pattern comes continuously.

Meanwhile, the margin bit replacing circuit 80 measures how long it has passed since a last zero-crossing of the cumulative DSV. When a more than certain time has passed (actually a time for 32 symbols, about 136 microseconds), a content of the most suitable margin bit 44A output from the PLA 43A is forcibly replaced with another in the range permitted by the EFM 3T-to-11T rule.

In the forcible replacement, the most suitable margin bit pattern is not only simply replaced; additionally, such a margin bit pattern containing "1" as "100", "010" or "001" is converted to "000" and the margin bit pattern "000" is converted to "100", "010" or "001" within the range permitted by the inhibit margin bit pattern.

That is, when the margin bit replacing circuit 80 operates, the 17NWD becomes −3; however the CWLL goes high starting with a next symbol to make the 17NWD go up to +1, forcibly putting the cumulative DSV in a zero-converging direction.

Figure 17:
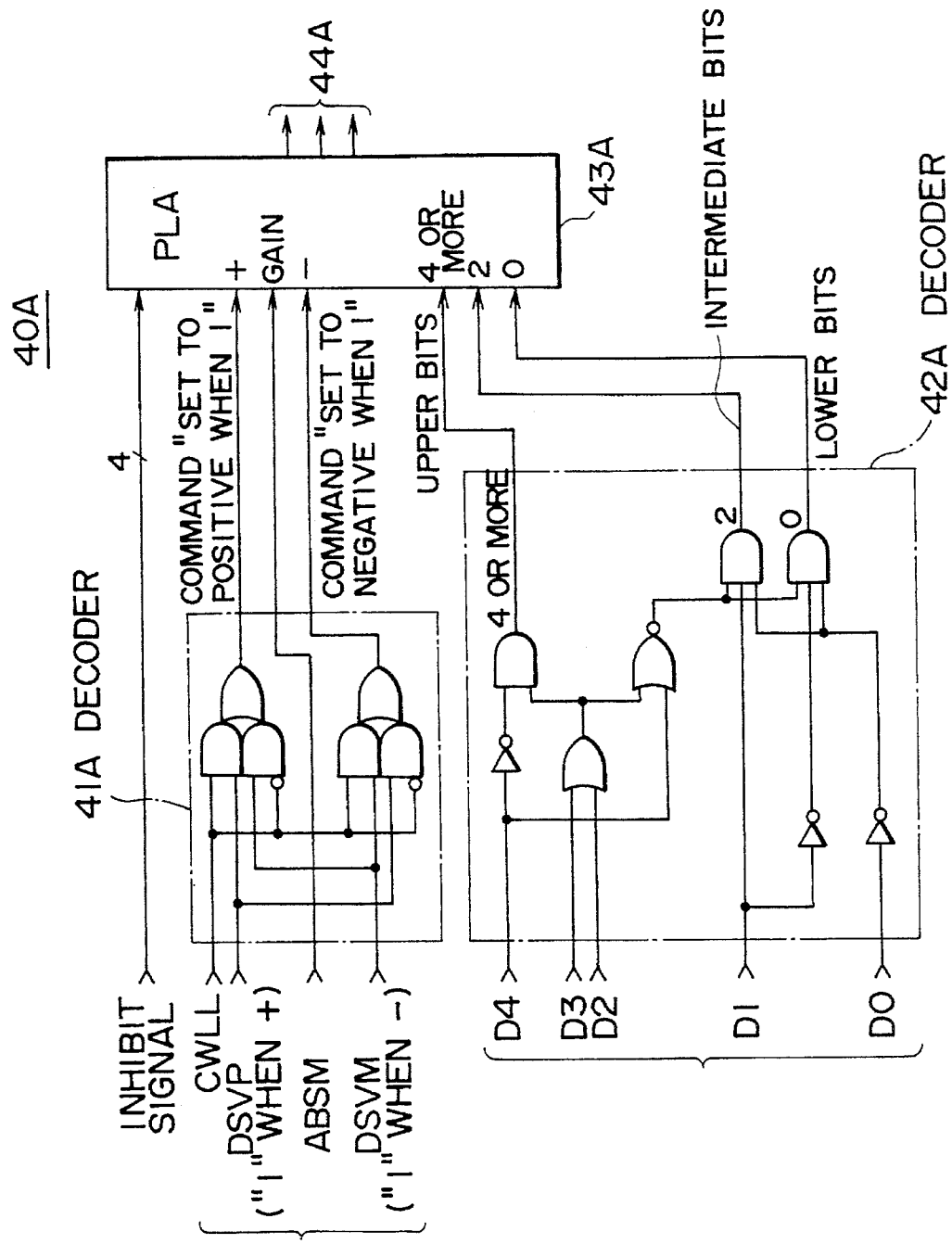
FIG. 17 is a diagram illustrating a margin bit generator practiced as a preferred embodiment of the invention.
Figure 16:
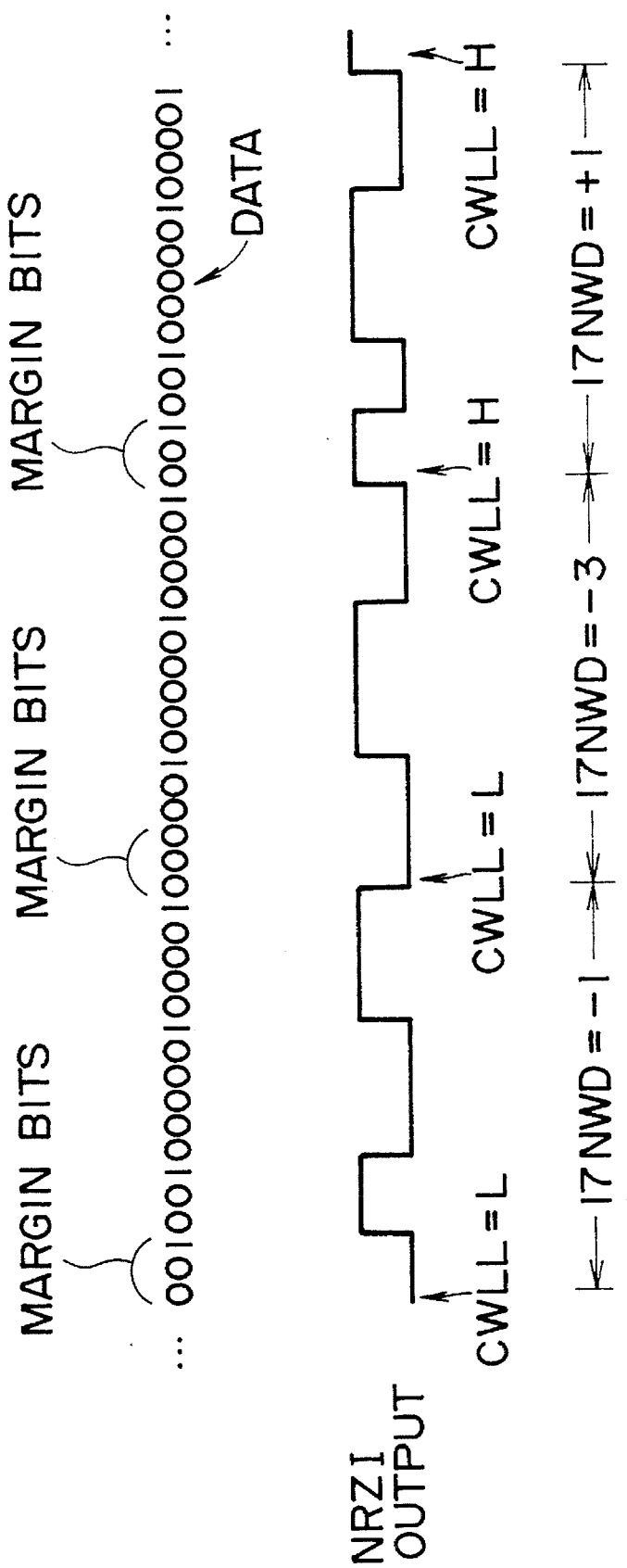
FIG. 16 is a diagram for describing how a margin bit pattern is determined.

Referring to FIG. 17, a margin bit generator 40A operates as follows. The margin bit generator 40A outputs a most suitable margin bit pattern from among the four types of the margin bit patterns "100", "010", "001" and "000" mentioned above.

Unlike the prior-art counterpart which controls the margin bits through a polarity of the cumulative DSV alone, the margin bit generator 40A monitors a magnitude of the absolute value of the cumulative DSV to output a margin bit pattern having a proper gain. Signals to enter this circuit are as follows.

First, a 4-bit inhibit signal comes from the inhibit margin bit decision circuit 20. This 4-bit inhibit signal indicates that a margin bit pattern cannot be inserted between two pieces of 14-bit data Db and Dp because the pattern violates the EFM 3T-to-11T rule or erroneously generates a frame sync signal. The indication is made by setting a bit corresponding to the margin bit pattern to "1". For example, of the four types of margin bit patterns "100", "010", "001" and "000", if the first and third patterns are inhibited, this 4-bit inhibit signal becomes "1010".

Next, a 3-bit control signal comes from the DSV integrator 60A according to the cumulative DSV. A most significant bit of this 3-bit control signal indicates a desirable control direction of the cumulative DSV is an increment direction (+). A mid bit of the control signal instructs a maximum gain or a minimum gain to be used for directing the cumulative DSV. A least significant bit of the control signal indicates that the desirable control direction of the cumulative DSV is a decrement direction (−).

Consequently, in the case where the cumulative DSV≦− 5, the control signal is set to "110" to instruct to increment the cumulative DSV by using the maximum gain; in the case where −5<the cumulative DSV <0, the control signal is set to "100" to instruct to increment the cumulative DSV by using the minimum gain; in the case where the cumulative DSV=0, the control signal is set to "000" to make the cumulative DSV change as little as possible; in the case where 0<the cumulative DSV<4, the control signal is set to "001" to instruct to decrement the cumulative DSV by using the minimum gain; and in the case where 4≦ the cumulative DSV, the control signal is set to "011" to instruct to decrement the cumulative DSV by using the maximum gain. It should be noted that all of the above-mentioned cases are valid when CWLL="0".

A monograph for obtaining a 17NWD from a 14NWD is the same as used in the prior-art technology.

Figure 18:
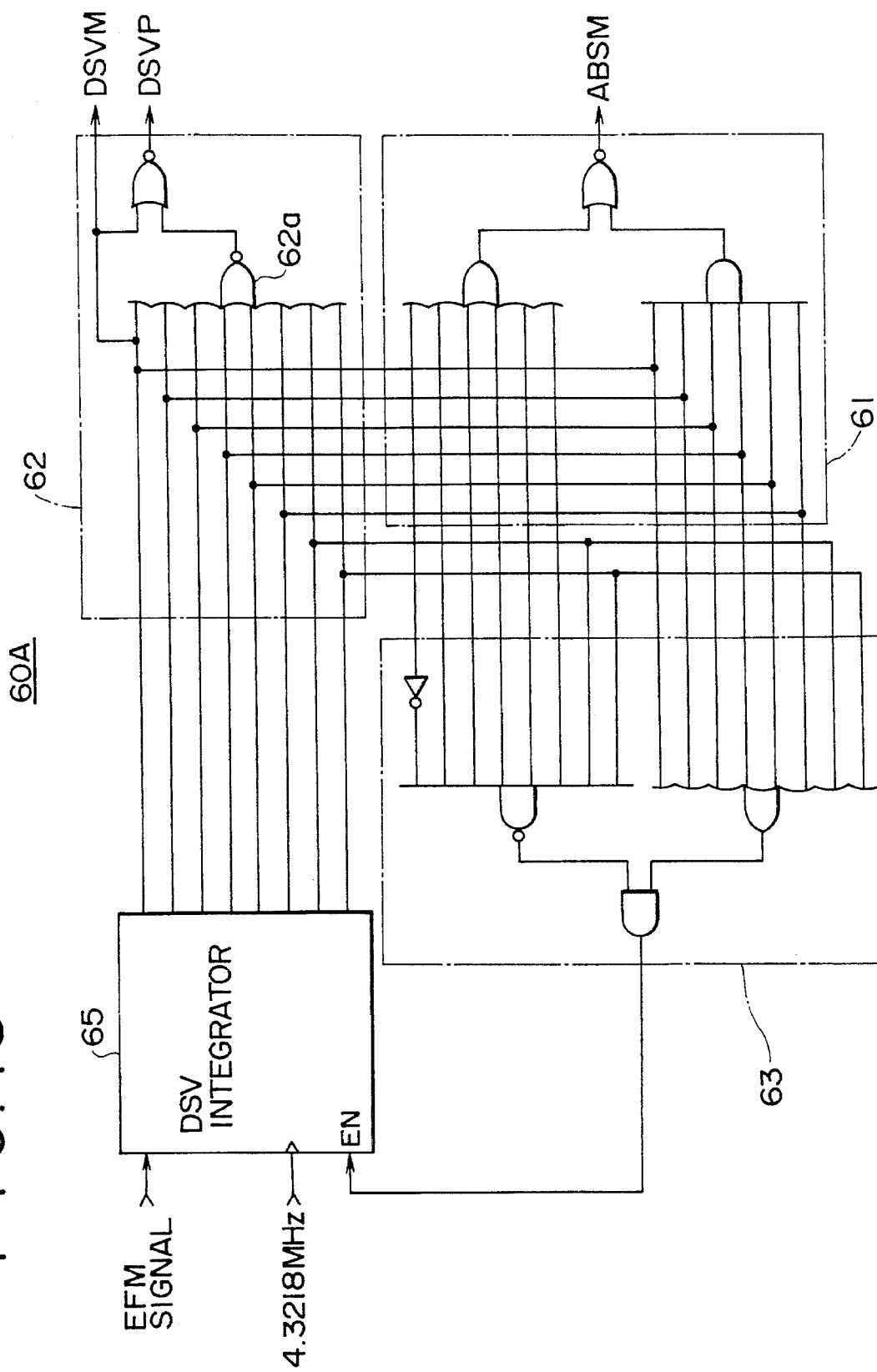
FIG. 18 is a block diagram of a DSV integrator practiced as a preferred embodiment of the invention.

FIG. 18 shows a preferred embodiment of the DSV integrator 60A. A DSV integrator 65 increments by one (+1) when a EFM signal is high for one T based on a channel clock (4.3218 MHz) and decrements by one (−1) when the EFM signal is low for one T. Since this integrator 65 consists of eight bits and a signal to handle is represented in a two's complement, up to ±128 states are represented. A most significant bit of the integrator 65 indicates a sign of an integrated value: when this bit is "0" it indicates a plus sign; when this bit is "1", it indicates a minus sign.

This sign decision is performed by a decoder 62 of FIG. 18. The most significant bit of the integrator 65 provides a DSVM signal, or the sign bit. When this bit is "1", the cumulative DSV is negative An 8-input NOR circuit 62a in the decoder 62 detects that the integrated value is ±0. An output of the NOR circuit is NORed with the DSVM to output DSVP. That is, if the cumulative DSV is neither negative nor 0, it is positive.

A decoder 61 determines a magnitude of an absolute value of the cumulative DSV. If upper six bits of the 8-bit integrator 65 are all "0"s or all "1"s (−4 ≦DSV≦+3), the ABSM is set to "0" to send a minimum gain instruction to a margin bit generating PLA 40A.

Conversely, if the upper six bits of the 8-bit integrator 65 are neither all "0"s nor all "1"s (+4≦ DSV or −5≧DSV), a maximum gain instruction is sent to the PLA 40A. Namely, the upper six bits being all "0"s or all "1"s denotes that 8-bit data fall in an area of ABSM=0 as shown in FIG. 19.

The decoder 63 is an overflow limiter of the integrator 65 and issues an increment inhibit instruction when the cumulative DSV is +127 and a decrement inhibit instruction when the cumulative DSV is −128. Controlling an enable EN of the DSV integrator 65 by these instructions prevents the DSV integrator from overflowing.

Referring to FIG. 17, the margin bit generator 40A will be described again.

In FIG. 17, a decoder 41A converts the 3-bit control signal with the CWLL signal used as a gate signal so that an algorithm for determining a margin bit pattern when the CWLL="0" can also be used when the CWLL="1". FIG. 20 shows a truth table for the decoder 41A.

A decoder 42A converts the 14NWD represented in a 5-bit two's complement into a 4-bit signal that represents the above-mentioned five cases. FIG. 21 shows a truth table for the decoder 42A.

Reference numeral 43A indicates a PLA programmed beforehand so that it outputs the most suitable margin bit pattern 44A from the 4-bit inhibit signal supplied from the inhibit margin bit decision circuit 20, the 3-bit control signal supplied from the decoder 41A, and the 5-bit signal supplied from the decoder 42A.

FIG. 22 shows a truth table preprogrammed in the PLA 43A. This truth table consists of 55 terms with the CWLL= "0". The same truth table can be used between the case where the CWLL="0" and the case where the CWLL="1" through conversion by the decoder 41A. Therefore, only the truth table having 55 terms is actually programmed in the PLA 43A.

In FIG. 22, "1" indicates a flag established while "0" indicates a flag not established. "X" indicates "don't care, or there is no need for distinguishing between the established and not established flags. For example, top four rows (terms) of the truth table of FIG. 22 denote as follows.

If the CWLL=0 and the control signal="XX0" (at least not a decrement instruction), and if the 14NWD ≧4, then the margin bit patterns "000", "100", "010" and "001" are prioritized in this order. That is, if the margin bit pattern "000" of the first priority is not inhibited (the inhibit signal="XXX0"), this pattern is output as the most suitable margin bit pattern.

If the margin bit pattern "000" of the first priority is inhibited and the margin bit pattern "100" of the second priority is not inhibited (the inhibit signal="XX01"), then the margin bit pattern "100" of the second priority is output as the most suitable margin bit pattern.

If both the margin bit patterns of the first and second priorities are inhibited and the margin bit pattern of the third priority is not inhibited (the inhibit signal="X011"), then the margin bit pattern ("010") of the third priority is output as the most suitable margin bit pattern. If all of the margin bit patterns of the first, second and third priorities are inhibited (the inhibit signal="0111"), then the margin bit "001" of the fourth priority is output.

Thus, without testing each margin bit pattern individually, the most suitable margin bit pattern 44A logically determined by the PLA 43A is output.

Now, referring to FIG. 23, suppose that certain data "A" is added with a margin bit pattern. Information required for this addition is as follows as mentioned above:

(a) the inhibit margin bit pattern;

(b) the CWLL;

(c) the DSV up to data "Z" and a signal (ABSM) concerning a magnitude of its absolute value; and (d) the 14NWD of the data "A".

Suppose that the DSV up to the data "Z" is +30 because of such factors as the inhibit margin bits. It is most desirable that a DC component of 17 bits, or a sum of the data "A" and the margin bit pattern to be added to it, be negative and large in value to converge the DSV to 0. Suppose again that conditions for making the DC component negative and large are as follows:

(a) the inhibit margin bit pattern=none;

(b) the CWLL=low;

(c) the DSV up to data "Z" and a signal (ABSM) concerning a magnitude of its absolute value=+30 (ABSM =high); and (d) the 14NWD of the data "A"=+2.

Because the DSV is as large as +30, for the DSV to be increasingly converged to 0, it is desirable that a sum (17NWD) of the DC components of the data "A" and the margin bit pattern added to it be negative and large in value. A relationship between the margin bit patterns and the DSV values is as follows:

(1) when the margin bit pattern "100" is selected, then 17NWD =±(−14NWD+3)=+1 . . . DSV=+30→+31;

(2) when the margin bit pattern "010" is selected, then 17NWD=±(−14NWD+1)=∓ . . . DSV=+30→+33;

(3) when the margin bit pattern "001" is selected, then 17NWD=±(−14NWD−1)=−3 . . . DSV=+30→+27; and (4) when the margin bit pattern "000" is selected, then 17NWD=±(14NWD−3)=−1 . . . DSV=+30→+29.

CWLL=low→+

CWLL=high→−

Thus, only when the margin bit pattern "001" or "000" is selected, the DSV converges to zero. Conversely, there are the two types of margin bit patterns that cause the DSV to converge to zero. Since the DSV has a large absolute value, it is ideally desirable that the 17NWD be negative and large in value. Hence, the margin bit pattern "001" is selected under such a condition.

In this connection, in the conventional control technique in which a margin bit pattern is selected only based on DSV polarities, the same condition results in selection of the margin bit pattern "000", providing a decrement as small as from +30 to +29.

Now, suppose that data "B" shown in FIG. 23 is given under following conditions:

(a) the inhibit margin bit=none;

(b) the CWLL=low;

(c) the DSV up to data "Z" and a signal (ABSM) concerning a magnitude of its absolute value=+27 (ABSM =high); and (d) the 14NWD of the data "A"=+4.

DSV transitions resulted from the margin bit pattern selections will be as follows:

(1) when the margin bit pattern "100" is selected, then 17NWD=±(−14NWD+3)=−1 . . . DSV=+27→+26;

(2) when the margin bit pattern "010" is selected, then 17NWD=±(−14NWD+1)=−3 . . . DSV=+27→+24;

(3) when the margin bit pattern "001" is selected, then 17NWD=±(−14NWD−1)=−5 . . . DSV=+27→+22;

(4) when the margin bit pattern "000" is selected; then 17NWD=±(14NWD−3)=+1 . . . DSV=+27→+28.

There are three margin bit patterns that make the 17NWD negative. Since the DSV is positive and large in value, it is advantageous for the 17NWD to be negative and large in value in converging the DSV. Hence, in the above-mentioned conditions, the margin bit pattern "001" is selected.

In this connection, the conventional technique selects the margin bit pattern "010", so that the DSV changes in its magnitude as small as from +29 to +26.

Figure 24:
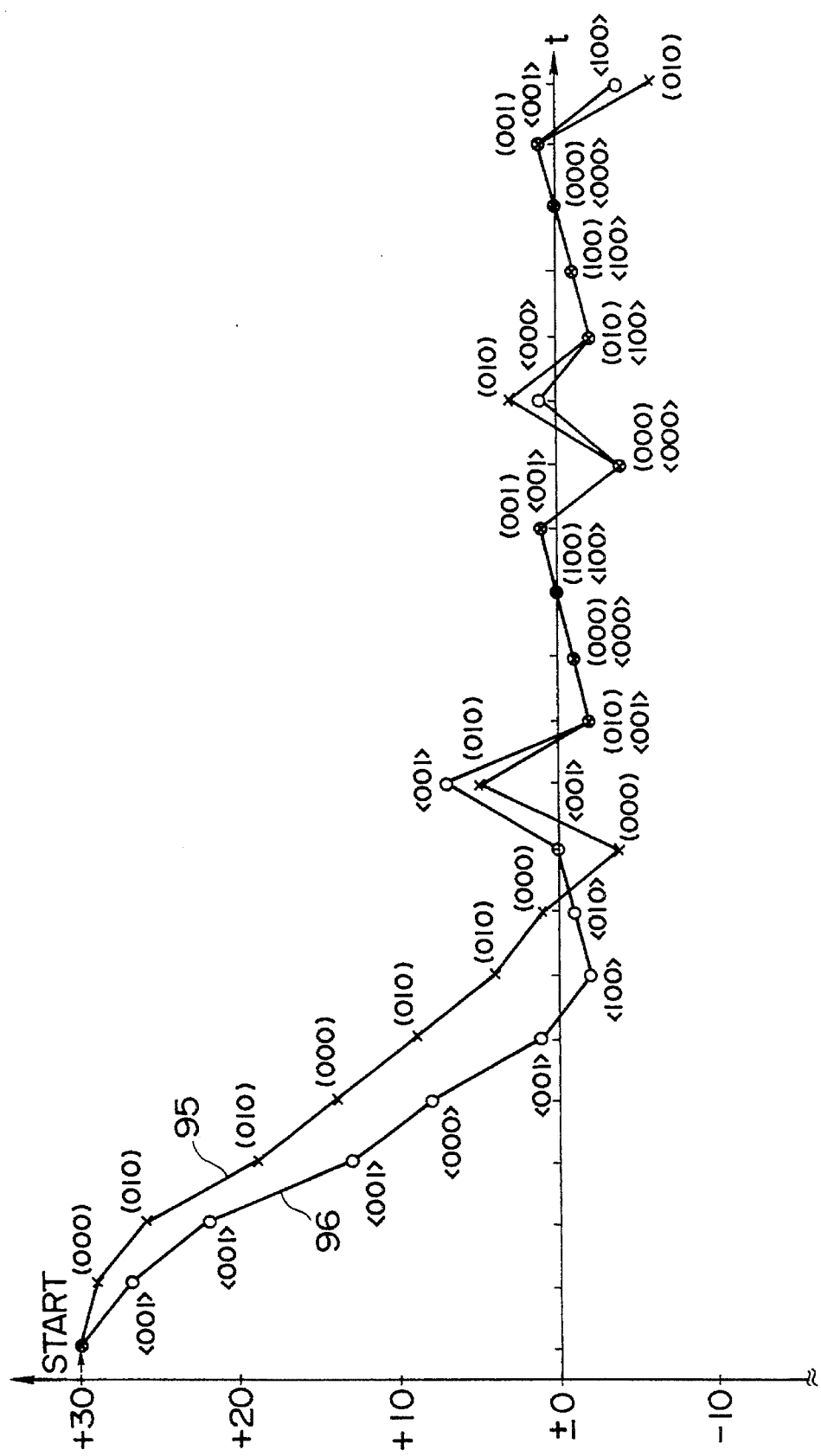
FIG. 24 is a diagram illustrating a difference in convergence between a locus of the DSV according to the invention and a locus obtained on a prior-art counterpart.

FIG. 24 shows curves obtained by plotting the above-mentioned DSV transitions. Curve 95 is obtained by the conventional control technique, while curve 96 is obtained by the novel art. A difference in speed in converging the DSV which has greatly deviated from zero because of the inhibit margin bit pattern or the like is obvious between both the techniques. It should be noted that the curves of FIG. 24 have been obtained by supposing that the CWLL of all data is low and there are inhibit margin bit patterns.

Now, a difference in stability of the DSV between the conventional and novel control techniques when the DSV is in the neighborhood of zero will be described with reference to FIG. 25. Suppose that the DSV up to data "Z" is −4. And suppose that each 14NWD of following data is ±0. The conditions are:

(a) the inhibit margin bit pattern=none;

(b) the CWLL=low;

(c) the DSV up to data "Z" and a signal (ABSM) concerning a magnitude of its absolute value =−4 (ABSM =low); and (d) the 14NWD of the data "A"=±0.

DSV transitions resulted from the margin bit pattern selections will be as follows:

(1) when the margin bit pattern "100" is selected, then 17NWD=±(−14NWD+3)=∓ . . . DSV=−4→−1;

(2) when the margin bit pattern "010" is selected, then 17NWD=±(−14NWD+1)=+1 . . . DSV=−4→−3;

(3) when the margin bit pattern "001" is selected, then 17NWD=±(−14NWD−1)=−1 . . . DSV=−4→−5;

(4) when the margin bit pattern "000" is selected; then 17NWD=±(14NWD−3)=−3 . . . DSV=−4→−7.

Thus, the margin bit patterns that take the DSV in a converging direction are "100" and "010". Of these margin bit patterns, "100" is more excellent in zero-convergence because the DSV up to data "Z" is −4 as long as this one symbol is concerned.

However, if the margin bit pattern "100" is selected here, there is no inhibit margin bit pattern because the 14NWD of next data "B" is also supposed to be ±0. And if the CWLL is also low, "100" is also selected as a margin bit pattern to be added to the data "B". This is the selection represented by the DSV curve 95 of FIG. 25 obtained by the conventional control technique. Although the zero convergence is excellent in this case, the DSV zero-crossing is heavy, making the curve unstable.

On the other hand, if "010" is selected instead of "100" as the margin bit pattern to be added to data "A" the DSV is drawn back as small as from −4 to −3 for a single symbol. However, if the same condition continues, the DSV curve 96 finely converges to zero from −4 to −3 to −2 to −1 to ±0.

Consequently, the DSV obtained according to the present invention has no excess zero-cross and its value is more stable than that obtained by the prior-art technique as shown in FIG. 25.

Thus, according to the invention, control for drawing the DSV back to zero is made by monitoring the absolute value of the DSV (by controlling the maximum and minimum gains), resulting in following advantages:

(1) if the absolute value of the DSV is large, the DSV is drawn back to zero with a maximum force (maximum gain control), resulting in the excellent DSV convergence; and (2) if the absolute value of the DSV is small, the DSV is drawn back to zero with a minimum force (minimum gain control), resulting in no excess zero-crossing to further stabilize the DSV curve.

In summary, according to the invention, margin bit patterns that satisfy the EFM 3T-to-11T rule are first selected at a connection between information bit patterns; then a margin bit pattern most suitable for bringing the DSV to zero by monitoring the absolute value of the DSV and with a suitable gain is selected from the first selected group.

It will be apparent that, in addition to the CD-based modulator, the above-mentioned technological concept according to this invention applies in general to any modulating circuit that converts an input m bit codes to n channel bit patterns (where n>m) which are linked to each other with one of multiple margin bit patterns to limit maximum and minimum recording wavelengths and suppress a low frequency component of a recording waveform.

Thus, the above-mentioned modulator having the margin bit generator according to the invention allows enhance the convergence of the cumulative DSV and eliminate the instability caused by convergence control by monitoring the absolute value of the cumulative DSV and using a proper gain, unlike the conventionally practiced method in which the margin bit pattern most suitable for the convergence control is selected only based on the polarity of the cumulative DSV.

While the preferred embodiments of the invention have been described using specific terms, such description is for illustrative purpose only, and it is to be understood that changes and variations may be made without departing from the spirit or scope of the appended claims.

What is claimed is:

1. A modulator for converting input m bit code series to n channel bit patterns (where n>m) which are linked to each other with one of a plurality of margin bit patterns to limit maximum and minimum recording wavelengths and suppress a low-frequency component of a recording waveform, comprising:

means for receiving:

an inhibit signal indicating which of said plurality of margin bit patterns are to be inhibited;

a level signal representing a final level of a modulated signal waveform for each of said n channel bit patterns, said n channel bit patterns being positioned before each of said plurality of margin bit patterns;

a polarity signal indicating a polarity of a cumulative digital sum variation;

a control signal indicating a magnitude of an absolute value of said cumulative digital sum variation;

a variation signal indicating said cumulative digital sum variation of each of said n channel bit patterns to be placed after each of said plurality of margin bit patterns; and margin bit generating means for selecting a margin bit pattern most suitable for controlling said cumulative digital sum variation from among said plurality of margin bit patterns based on said inhibit, level, polarity, control and variation signals.

2. A modulator according to claim 1, wherein said polarity signal comprises a signal indicating that the polarity of said digital sum variation is positive and a signal indicating that the polarity of said digital sum variation is negative and wherein said control signal indicates that said cumulative digital sum variation is to be drawn to zero by one of a maximum gain or a minimum gain according to the magnitude of the absolute value of said cumulative digital sum variation.

3. A modulator according to claim 1, further comprising:

a decision circuit for determining an occurrence of zero-crossing of said cumulative digital sum variation; and replacing means for measuring a time passed since the occurrence of said zero-crossing of said cumulative digital sum variation to forcibly replace, after a certain time since the occurrence of said zero-crossing, a margin bit pattern output from said margin bit generating means with another margin bit pattern.

\* \* \* \* \*